United States Patent
Zou et al.

(10) Patent No.: US 11,519,986 B2
(45) Date of Patent: Dec. 6, 2022

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Lijun Zou, Shanghai (CN); Xingen Yu, Shanghai (CN); Jianfeng Liu, Shanghai (CN); Shuguang Liu, Shanghai (CN); Shiqing Lin, Shanghai (CN); Bo Li, Shanghai (CN)

(73) Assignee: SHANGHAI UNITED IMAGING HEALTHCARE CO., LTD., Shanghai (CN)

(*) Notice: Subject to any disclaimer, the term of this patent is extended or adjusted under 35 U.S.C. 154(b) by 0 days.

(21) Appl. No.: 17/148,594

(22) Filed: Jan. 14, 2021

(65) Prior Publication Data
US 2021/0223339 A1    Jul. 22, 2021

(30) Foreign Application Priority Data

Jan. 19, 2020  (CN) .................... 202020125774.8
Nov. 17, 2020  (CN) .................... 202022656784.7

(51) Int. Cl.
*G01R 33/421*    (2006.01)
*G01R 33/3815*    (2006.01)
*G01R 33/38*    (2006.01)
*G01R 33/385*    (2006.01)

(52) U.S. Cl.
CPC ..... *G01R 33/4215* (2013.01); *G01R 33/3804* (2013.01); *G01R 33/385* (2013.01); *G01R 33/3815* (2013.01)

(58) Field of Classification Search
CPC ............ G01R 33/4215; G01R 33/3804; G01R 33/3815; G01R 33/385
See application file for complete search history.

(56) References Cited

U.S. PATENT DOCUMENTS

| | | | |
|---|---|---|---|
| 9,279,871 B2 | 3/2016 | Shen et al. | |
| 9,322,892 B2 | 4/2016 | Shen et al. | |
| 10,185,019 B2 | 1/2019 | Shen et al. | |
| 2018/0144851 A1 | 5/2018 | Li et al. | |

FOREIGN PATENT DOCUMENTS

| | | | | |
|---|---|---|---|---|
| CN | 103901371 B | 4/2017 | | |
| CN | 210572693 U | 5/2020 | | |
| DE | 3900725 A1 | * 7/1990 | ......... | G01R 33/3815 |
| EP | 0681189 A1 | * 11/1995 | ........... | G01R 33/421 |

* cited by examiner

*Primary Examiner* — G. M. A Hyder
(74) *Attorney, Agent, or Firm* — Metis IP LLC

(57) ABSTRACT

The present disclosure relates to systems and methods for magnetic resonance imaging (MRI). The systems may include a gradient coil assembly configured to form a gradient magnetic field. The systems may also include a cryostat including a superconducting coil assembly and a magnetic field shielding apparatus arranged on/in a component of the cryostat. The superconducting coil assembly may be configured to form a main magnetic field. The magnetic field shielding apparatus may be configured to shield the superconducting coil assembly from a stray field of the gradient coil assembly. The magnetic field shielding apparatus may include a conductive shielding component, a shielding cylinder, or a combination thereof.

19 Claims, 21 Drawing Sheets

SYSTEMS AND METHODS FOR MAGNETIC RESONANCE IMAGING

CROSS-REFERENCE TO RELATED APPLICATIONS

This application claims priority to Chinese Patent Application No. 202020125774.8 filed on Jan. 19, 2020 and Chinese Patent Application No. 202022656784.7 filed on Nov. 17, 2020, the contents of each of which are incorporated herein by reference in their entirety.

TECHNICAL FIELD

The present disclosure generally relates to a medical imaging system, and more particularly, relates to systems and methods for magnetic resonance imaging (MRI).

BACKGROUND

MRI systems are often used to diagnose pathology and internal injuries. A typical MRI system may include a gradient coil assembly and a superconducting coil assembly that is arranged in a cryostat of the MRI system. A stray field generated by the gradient coil assembly may generate an eddy current on coils of the superconducting coil assembly, skeletons of the coils, and/or the cryostat of the MRI system. The eddy current may cause a temperature of the coils of the superconducting coil assembly, the skeletons of the coils, and/or the cryostat to rise. The superconducting coil assembly needs to work at an environment with an extremely low temperature, the temperature rise may cause a flux jump of the superconducting coil assembly, a quench of the superconducting coil assembly, and/or a large amount of volatilization of a cooling medium (e.g., liquid helium) of the superconducting coil assembly, thereby affecting a normal operation of the MRI system. Therefore, it is desirable to provide improved systems and methods for magnetic resonance imaging (MRI), which can shield the stray field of the gradient coil assembly, thereby reducing or eliminating the generation of the eddy current.

SUMMARY

An aspect of the present disclosure relates to a system for magnetic resonance imaging (MRI). The system may include a gradient coil assembly configured to form a gradient magnetic field. The systems may also include a cryostat including a superconducting coil assembly and a magnetic field shielding apparatus arranged on/in a component of the cryostat. The superconducting coil assembly may be configured to form a main magnetic field. The magnetic field shielding apparatus may be configured to shield the superconducting coil assembly from a stray field of the gradient coil assembly. The magnetic field shielding apparatus may include a conductive shielding component, a shielding cylinder, or a combination thereof.

In some embodiments, the conductive shielding component may be arranged integrally or at intervals on the component of the cryostat along an axial direction of the superconducting coil assembly.

In some embodiments, the conductive shielding component may include one or more shielding units that are arranged at intervals on the component of the cryostat along the axial direction of the superconducting coil assembly. A width of each of the one or more shielding units along the axial direction of the superconducting coil assembly may be not less than a width of a coil of superconducting coil assembly corresponding to the shielding unit.

In some embodiments, the component of the cryostat may include the superconducting coil assembly, an outer container, an inner container, and/or an intermediate layer arranged between the outer container and the inner container.

In some embodiments, the superconducting coil assembly may include one or more inner coils and one or more outer coils. For at least one of the one or more inner coils, a shielding unit may be arranged on an inner side of the at least one of the one or more inner coils. The inner side may be a side close to the gradient coil assembly.

In some embodiments, for at least one of the one or more outer coils, a shielding unit may be arranged on an outer side of the at least one of the one or more outer coils. The outer side may be a side away from the gradient coil assembly.

In some embodiments, the conductive shielding component may be arranged on a target side, close to the gradient coil assembly, of at least one of the outer container, the inner container, or the intermediate layer. The conductive shielding component may be a hollow conductor.

In some embodiments, a temperature of the conductive shielding component may be controlled through at least one external refrigeration source or a refrigeration component included in a cryostat.

In some embodiments, the shielding cylinder may include a mounting cylinder and a plurality of conductive components arranged on/in the mounting cylinder. The mounting cylinder may include a target side, close to the gradient coil assembly, of at least one of an outer container, an inner container, or an intermediate layer of the cryostat.

In some embodiments, the plurality of conductive components may be arranged at positions close to the two ends of the mounting cylinder and machined from a metal plate.

In some embodiments, the mounting cylinder may include a plurality of mounting slots. The plurality of conductive components may be arranged in the plurality of mounting slots.

In some embodiments, the plurality of mounting slots may include through slots or blind slots. The blind slots may be located on an inner wall or an outer wall of the mounting cylinder.

In some embodiments, the shielding cylinder may include a mounting frame.

The plurality of conductive components may be mounted on an inner wall or an outer wall of the mounting cylinder by the mounting frame.

In some embodiments, the shielding cylinder may include a plurality of mounting joints. The plurality of conductive components may be mounted by the plurality of mounting joints.

In some embodiments, the plurality of conductive components may be embedded inside the mounting cylinder.

In some embodiments, each of the plurality of conductive components may be in a ring shape or a sheet shape. The plurality of conductive components in the sheet shape may be arranged at intervals along a circumferential direction of the mounting cylinder.

A further aspect of the present disclosure relates to a system for magnetic resonance imaging (MRI). The system may include a gradient coil assembly configured to form a gradient magnetic field and a cryostat. The cryostat may include an outer container, an inner container, and/or an intermediate layer between the outer container and the inner container. The cryostat may also include a superconducting coil assembly configured to form a main magnetic field. The cryostat may also include a magnetic field shielding apparatus configured to shield the superconducting coil assembly from a stray field of the gradient coil assembly. The magnetic field shielding apparatus may include a conductive shielding component arranged on/in the superconducting coil assembly or a target side, close to the gradient coil assembly, of at least one of the outer container, the inner container, or the intermediate layer.

In some embodiments, the conductive shielding component may include a hollow conductor arranged at intervals along an axial direction of the superconducting coil assembly.

A still further aspect of the present disclosure relates to a system for magnetic resonance imaging (MRI). The system may include a gradient coil assembly configured to form a gradient magnetic field and a cryostat. The cryostat may include an outer container, an inner container, and/or an intermediate layer between the outer container and the inner container. The cryostat may also include a superconducting coil assembly configured to form a main magnetic field. The cryostat may also include a magnetic field shielding apparatus configured to shield the superconducting coil assembly from a stray field of the gradient coil assembly. The magnetic field shielding apparatus may include a mounting cylinder and a plurality of conductive components arranged on/in the mounting cylinder. The mounting cylinder may include a target side, close to the gradient coil assembly, of at least one of the outer container, the inner container, or the intermediate layer.

In some embodiments, the plurality of conductive components may be machined from a metal plate.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities, and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. These embodiments are non-limiting exemplary embodiments, in which like reference numerals represent similar structures throughout the several views of the drawings, and wherein:

FIG. 21A is a schematic diagram illustrating a front perspective view of a shielding cylinder according to some embodiments of the present disclosure, two conductive components of the shielding cylinder each of which is in a ring shape being embedded inside a mounting cylinder and respectively fixed at positions close to two ends of the mounting cylinder; and.

DETAILED DESCRIPTION

Figure 1:
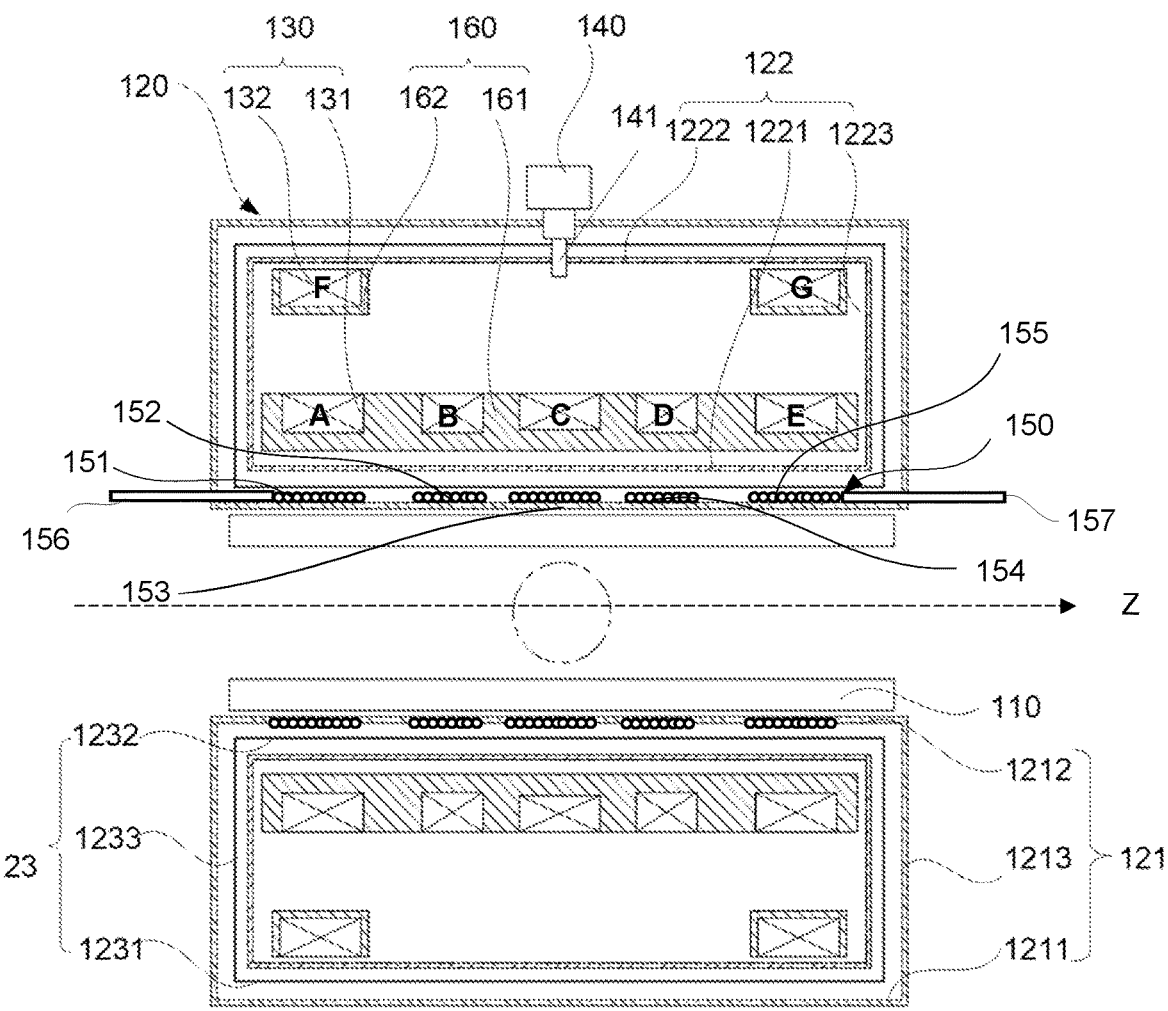
FIG. 1 is a schematic diagram illustrating a cross sectional view of an MRI system according to some embodiments of the present disclosure, the MRI system including a magnetic field shielding apparatus that includes a conductive shielding component arranged at intervals on an inner wall of a first outer side of an outer container of a cryostat.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "module," and/or "block" used herein are one method to distinguish different components, elements, parts, sections, or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or other storage devices. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included of connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage.

It will be understood that when a unit, engine, module, or block is referred to as being "on," "connected to," or "coupled to," another unit, engine, module, or block, it may be directly on, connected or coupled to, or communicate with the other unit, engine, module, or block, or an intervening unit, engine, module, or block may be present, unless the context clearly indicates otherwise. As used herein, the term "and/or" includes any and all combinations of one or more of the associated listed items.

In addition, it should be understood that in the description of the present disclosure, the terms "first", "second", or the like, are only used for the purpose of differentiation, and cannot be interpreted as indicating or implying relative importance, nor can be understood as indicating or implying the order.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The following descriptions are provided with reference to an MRI system in a superconducting state. The MRI system may be used for non-invasive imaging, which may be used for disease diagnosis, disease treatment, or research purposes. In some embodiments, the MRI system may include one or more modalities including a Magnetic Resonance Angiography (MRA) system, CT (computed tomography)-MRI system, DSA (digital subtraction angiography)-MRI system, PET (positron emission tomography)-MRI system, TMS (transcranial magnetic stimulation)-MRI system, US (ultrasound scanning)-MRI system, X-ray-MRI system, or the like, or any combination thereof.

An aspect of the present disclosure relates to systems and methods for MRI. The systems may include a gradient coil assembly configured to form a gradient magnetic field and a cryostat that houses a superconducting coil assembly configured to form a main magnetic field. The cryostat may include a magnetic field shielding apparatus arranged on/in a component (e.g., the superconducting coil, an outer container, an inner container, or an intermediate layer arranged between the outer container and the inner container) of the cryostat. The magnetic field shielding apparatus may be configured to shield the superconducting coil assembly from a stray field of the gradient coil assembly. The stray field of the gradient coil assembly may include a remnant magnetic field escaping from the gradient magnetic field of the gradient coil assembly. The magnetic field shielding apparatus may include a conductive shielding component, a shielding cylinder, or a combination thereof.

According to the systems and methods of the present disclosure, the stray field of the gradient coil assembly may be shielded by the magnetic field shielding apparatus, which can reduce or completely eliminate the generation of an eddy current induced by coils of the superconducting coil assembly, frames of the superconducting coil assembly, and/or the cryostat, thereby ensuring the normal and stable operation of the MRI system.

FIG. 1 is a schematic diagram illustrating a cross sectional view of an MRI system 100 according to some embodiments of the present disclosure. The MRI system 100 may scan an object located within its detection region (also referred to as imaging region) and generate a plurality of data relating to the object. The detection region of the MRI system 100 may be in a scanning bore of the MRI system 100. In the present disclosure, "subject" and "object" are used interchangeably. Mere by way of example, the object may include a patient, a man-made object, or the like, or any combination thereof. As another example, the object may include a specific portion, organ, and/or tissue of a patient. As a further example, the object may include a head, a brain, a neck, a body, a shoulder, an arm, a thorax, a heart, a stomach, a blood vessel, a soft tissue, a knee, feet, or the like, or any combination thereof.

In some embodiments, the MRI system 100 may be a close-bore MRI system or an open-bore MRI system. The MRI system 100 may include a gradient coil assembly 110, a radiofrequency (RF) coil assembly (not shown), and a cryostat 120, etc.

The gradient coil assembly 110 may be arranged in an axial through hole of the cryostat 120 along an axial direction Z and be configured to generate a gradient magnetic field. The gradient coil assembly 110 may generate one or more magnetic field gradient pulses to a main magnetic field in an X direction (Gx), a Y direction (Gy), and a Z direction (Gz) to encode spatial information of the object. The X direction, the Y direction, and the Z direction may form an orthogonal coordinate system. The X direction and the Z direction may be horizontal, and the Y direction may be vertical. The RF coil assembly may include a plurality of RF coils. The RF coil assembly may also be arranged in the axial through hole of the cryostat 120. The RF coil assembly may include a plurality of coils (e.g., transmit coils, receiver coils, etc.) for transmitting and/or receiving RF signals.

The cryostat 120 may include a superconducting coil assembly 130 that is arranged in a ring-shaped cavity of the cryostat 120. The superconducting coil assembly 130 may be configured to form a main magnetic field for polarizing the object. In some embodiments, the cryostat 120, the gradient coil assembly 110, and the superconducting coil assembly 130 may be assembled coaxially.

The cryostat 120 may maintain the superconducting coil assembly 130 in a superconducting state so that the superconducting coil assembly 130 may work properly. The superconducting state may refer to a state of a superconductor material in which the superconductor material has superconducting properties, such as a zero electrical resistive state. In some embodiments, the superconductor material may be in a superconducting state when the superconductor material is exposed in a low-temperature ambient (e.g., 4.2 K). In order to realize and maintain the superconducting state of the superconducting coil assembly 130, the cryostat 120 may also include a refrigeration component 140. As shown in FIG. 1, the refrigeration component 140 may include a cold head 141 with an extremely low temperature. In some embodiments, the cryostat 120 may accommodate a cooling medium and the superconducting coil assembly 130. The refrigeration component 140 may cool the superconducting coil assembly 130 by heat exchange between the cold head 141 and the cooling medium. Merely by way of example, the cooling medium may include liquid helium. In some embodiments, the cryostat 120 may include a heat conduction member (e.g., also referred to as a heat conduction pole) that is arranged between the superconducting coil assembly 130 and the cold head 141. The refrigeration component 140 may cool the superconducting coil assembly 130 by the heat conduction member.

In some embodiments, the cryostat 120 may be a multi-layer structure including one or more shells. The one or more shells may include an outer container 121, an inner container 122, and/or an intermediate layer 123 arranged between the outer container 121 and the inner container 122. The outer container 121 may be made of steel, for example, carbon steel, stainless steel, etc. The outer container 121 may include a first outer side 1211, a first inner side 1212, and two first connection sides 1213 connecting the first outer side 1211 and the first inner side 1212. The first outer side 1211 and the first inner side 1212 may be hollow cylinders. The first connection sides 1213 may be a ring-shaped structure. The first outer side 1211, the first inner side 1212, and the first connection sides 1213 may form the ring-shaped cavity that is used to accommodate other components (e.g., the inner container 122, the intermediate layer 123, the superconducting coil assembly 130) of the cryostat 120.

In some embodiments, the inner container 122 may be arranged in the ring-shaped cavity. The inner container 122 may include a second outer side 1221, a second inner side 1222, and two second connection sides 1223 connecting the second outer side 1221 and the second inner side 1222. The second outer side 1221 and the second inner side 1222 may be hollow cylinders. The second connection sides 1223 may be a ring-shaped structure. In some embodiments, the cryostat 120 may not include the inner container 122.

In some embodiments, the intermediate layer 123 may include a third outer side 1231, a third inner side 1232, and two third connection sides 1233 connecting the third outer side 1231 and the third inner side 1232. The third outer side 1231 and the third inner side 1232 may be hollow cylinders. The third connection sides 1233 may be a ring-shaped structure. The third outer side 1231 may be located between the first outer side 1211 and the second outer side 1221; the third inner side 1232 may be located between the first inner side 1212 and the second inner side 1222; each of the third connection sides 1233 may be located between a first connection side 1213 and a second connection side 1223. In some embodiments, the cryostat 120 may not include the intermediate layer 123.

In some embodiments, the superconducting coil assembly 130 may be arranged in the inner container 122. The superconducting coil assembly 130 may include a plurality of coils (e.g., A, B, C, D, E, F, G) and a skeleton 160 for supporting the plurality of coils. The skeleton 160 may be provided with a coil slot for accommodating the superconducting coil assembly 130. In some embodiments, the superconducting coil assembly 130 may include one or more inner coils 131 (e.g., A, B, C, D, E) and one or more outer coils 132 (e.g., F, G). The skeleton 160 may include an inner skeleton 161 for supporting the one or more inner coils 131 and an outer skeleton 162 for supporting the one or more outer coils 132. The inner skeleton 161 and the outer skeleton 162 may be a ring-shaped structure coaxial with the cryostat 120. Each of the one or more inner coils 131 may be wound on the inner skeleton 161 and each of the one or more outer coils 132 may be wound on the outer skeleton 162. A radial size of the outer skeleton 162 may be larger than a radial size of the inner skeleton 161.

In some embodiments, during an imaging process, the gradient coil assembly 110 may generate a high-frequency vibration and drive the cryostat 120 and a component (e.g., the superconducting coil assembly 130, the skeleton, the outer container 121, the inner container 122, the intermediate layer 123) of the cryostat 120 to vibrate together. The vibration combined with a stray field generated by the gradient coil assembly 110 may generate an eddy current on the cryostat 120 and/or the component (e.g., the superconducting coil assembly 130, the skeleton, the outer container 121, the inner container 122, the intermediate layer 123) of the cryostat 120. The eddy current may cause a temperature rise of the component (e.g., the superconducting coil assembly 130, the skeleton, the outer container 121, the inner container 122, the intermediate layer 123) of the cryostat 120. The temperature rise may cause a flux jump of the superconducting coil assembly 130, a quench of the superconducting coil assembly 130, and/or a large amount of volatilization of the cooling medium (e.g., the liquid helium) in the cryostat 120, thereby affecting a uniformity of the main magnetic field generated by the superconducting coil assembly 130 and the normal operation of the MRI system.

In addition, the outer container 121, the inner container 122, the inner skeleton 161, and/or the outer skeleton 162 are usually made of materials (e.g., stainless steel) with poor electrical or thermal conductivity, which has a poor shielding effect on the stray field and poor heat exchange performance. The intermediate layer 123 is usually made of aluminum alloy material, which has strong electrical conductivity and can shield a certain stray field. However, the intermediate layer 123 will generate heat while shielding the stray field, which will cause a temperature rise of the intermediate layer 123, directly affect cooling efficiency of the superconducting coil assembly 130, and even cause the MRI system 100 to crash.

In order to solve the above problem, the cryostat 120 provided in the present disclosure may further include a magnetic field shielding apparatus configured to shield the superconducting coil assembly 130 from a stray field of the gradient coil assembly 110, which may reduce or eliminate the generation of the eddy current and the temperature rise of the intermediate layer 123, and further reduce the temperature rise of the component of the cryostat 120 caused by the eddy current, thereby ensuring the normal and stable operation of the MRI system.

In some embodiments, the magnetic field shielding apparatus may include a conductive shielding component 150. The conductive shielding component 150 may be arranged between the superconducting coil assembly 130 and the gradient coil assembly 110. In some embodiments, the conductive shielding component 150 may be arranged on/in the component of the cryostat 120. The conductive shielding component 150 may be arranged on/in the outer container 121, the inner container 122, and/or the intermediate layer 123. For example, the conductive shielding component 150 may be arranged on a target side, close to the gradient coil assembly 110, of the outer container 121, the inner container 122, and/or the intermediate layer 123. The target side may include the first outer side 1211 of the outer container 121, the second outer side 1221 of the inner container 122, and/or the third outer side 1231 of the intermediate layer 123. The conductive shielding component 150 may be arranged on an inner wall of the target side facing the one or more inner coils 131. For example, as shown in FIG. 1, the conductive shielding component 150 may be arranged on an inner wall of the first outer side 1211 of the outer container 121 facing the one or more inner coils 131.

In some embodiments, the conductive shielding component 150 may be arranged on a circumferential surface of the target side of the outer container 121, the inner container 122, and/or the intermediate layer 123. Specifically, the conductive shielding component 150 may be evenly wound on the circumference of the target side facing the one or more inner coils 131. For example, the conductive shielding component 150 may be evenly wound on the circumference of the first outer side 1211 of the outer container 121 facing the one or more inner coils 131.

In some embodiments, in order to improve the shielding effect on the stray field of the gradient coil assembly 110, the conductive shielding component 150 may be arranged in a region where the stray field is relatively strong. For example, the stray field at positions (e.g., positions on the first outer side 1211 close to the first connection sides 1213) close to two ends of the target side, is relatively strong. The conductive shielding component 150 may be arranged at the positions close to the two ends of the target side.

In some embodiments, the conductive shielding component 150 may be arranged integrally or at intervals on the target side along an axial direction of the superconducting coil assembly 130. The conductive shielding component 150 may include one or more shielding units (e.g., 151, 152, 153, 154, 155) each of which may correspond to one of the one or more inner coils 131 (e.g., A, B, C, D, E) so that each of the one or more shielding units can protect one coil in a targeted manner. When the conductive shielding component 150 is arranged at intervals on the target side, a width of each of the one or more shielding units along the axial direction of the superconducting coil assembly 130 may be not less than a width of a coil of superconducting coil assembly 130 corresponding to the shielding unit, which may improve the shielding effect on the stray field. For example, a width of a shielding unit 151 may be not less than a width of an inner coil A; a width of a shielding unit 152 may be not less than a width of an inner coil B corresponding to the shielding unit 152; a width of a shielding unit 153 may be not less than a width of an inner coil C corresponding to the shielding unit 153; a width of a shielding unit 154 may be not less than a width of an inner coil D corresponding to the shielding unit 154; a width of a shielding unit 155 may be not less than a width of an inner coil E corresponding to the shielding unit 155.

In some embodiments, the conductive shielding component 150 may be arranged on at least one of the first connection sides 1213 of the outer container 121, the second connection sides 1223 of the inner container 122, and/or the third connection sides 1233 of the intermediate layer 123. More descriptions regarding the arrangement of the conductive shielding component 150 may be found elsewhere in the present disclosure, for example, FIGS. 2-4 and relevant descriptions thereof.

In some embodiments, in order to improve structural stability, the conductive shielding component 150 may be fixed by a physical mean such as welding or bonding. For example, the conductive shielding component 150 may be fixed on the inner wall of the target side facing the one or more inner coils 131 by welding, which may improve heat transfer efficiency between the conductive shielding component 150 and the target side.

In some embodiments, the conductive shielding component 150 may be made of metal material with high conductivity that can shield the stray field. For example, the conductive shielding component 150 may be made of copper or aluminum with a lower cost.

In some embodiments, the conductive shielding component 150 may be a hollow conductor (e.g., metal material with a hollow structure). For example, the conductive shielding component 150 may be a round tube, a rectangular tube, or other hollow structures with special-shaped cross-sections. In some embodiments, a wall thickness of the conductive shielding component 150 may be as small as possible, which may reduce skin effect of eddy currents. Merely by way of example, the wall thickness of the conductive shielding component 150 may be larger than or equal to 0.5 mm and less than or equal to 2 mm. In some embodiments, the wall thickness of the conductive shielding component 150 may be less than or equal to 5 mm, which can keep the cryostat 120 with a certain interlayer gap.

In some embodiments, the conductive shielding component 150 may generate heat while shielding the stray field, which may cause its own temperature to rise. In order to control the temperature of the conductive shielding component 150, the conductive shielding component 150 may be a temperature-controllable cooling cycle pipeline. The cooling cycle pipeline may reduce the temperature rise of the conductive shielding component 150 and cool components around the conductive shielding component 150. For example, the cooling cycle pipeline may cool the target side to reduce the temperature rise of the target side caused by a heat transfer of the gradient coil assembly 110. As another example, the cooling cycle pipeline may further cool the gradient coil assembly 110.

In some embodiments, the temperature of the conductive shielding component 150 may be controlled through an external refrigeration source. For example, when the conductive shielding component 150 is a hollow copper pipe and wound on the circumference of the first outer side 1211 of the outer container 121, two ends of the hollow copper pipe respectively pass through the two first connection sides 1213 of the outer container 121 to form an inlet 156 and an outlet 157. The inlet 156 may be connected to a first external refrigeration source and the outlet 157 may be connected to a second external refrigeration source. A cooling medium may flow from the inlet 156 to the outlet 157 via the conductive shielding component 150 to form the temperature-controllable cooling cycle pipeline. Merely by way of example, the cooling medium may be a medium with a constant temperature. In some embodiments, the inlet 156 and the outlet 157 may be connected to a same external refrigeration source.

During the imaging process, when the conductive shielding component 150 shields the stray field, an eddy current may be generated on the conductive shielding component 150. The eddy current may generate heat on the conductive shielding component 150. The heat would be quickly taken away by the cooling medium in the conductive shielding component 150 (i.e., the cooling cycle pipeline), which can ensure the normal and stable operation of the MRI system.

In some embodiments, during the imaging process, in order to maintain a uniformity of a magnetic field, it is necessary to keep a magnetic permeability of the first outer side 1211 of the outer container 121 stable. Generally, the outer container 121 is made of carbon steel or stainless steel. A magnetic permeability of the carbon steel or stainless steel is related to a temperature of the carbon steel or stainless steel. When the conductive shielding component 150 is wound on the circumference of the first outer side 1211 of the outer container 121, the cooling cycle pipeline (i.e., the conductive shielding component 150) may keep the first outer side 1211 of the outer container 121 at a certain temperature, which may ensure the stability of the magnetic permeability of the first outer side 1211 of the outer container 121.

In some embodiments, the gradient coil assembly 110 close to the first outer side 1211 of the outer container 121 may generate a lot of heat when working. The cooling cycle pipeline (i.e., the conductive shielding component 150) may indirectly cool the gradient coil assembly 110. In addition, the cooling cycle pipeline (i.e., the conductive shielding component 150) may also indirectly cool ferromagnetic shimming pieces or shimming bars arranged on the first outer side 1211 of the outer container 121 or in the gradient coil assembly 110.

In some embodiments, the cooling cycle pipeline (i.e., the conductive shielding component 150) may be used to change the main magnetic field or adjust a uniformity of the main magnetic field. For example, a magnetic medium may be added to the cooling medium flowing through the cooling cycle pipeline, that is, a certain amount of magnetic medium fluid may be passed into the cooling cycle pipeline. A certain magnetic field may be generated after the magnetic medium is magnetized. The magnetic field may be superimposed with the main magnetic field to affect an intensity or the uniformity of the main magnetic field. In addition, an intensity of the superimposed field may be fine-tuned by adjusting a temperature of the magnetic medium fluid.

Figure 2:
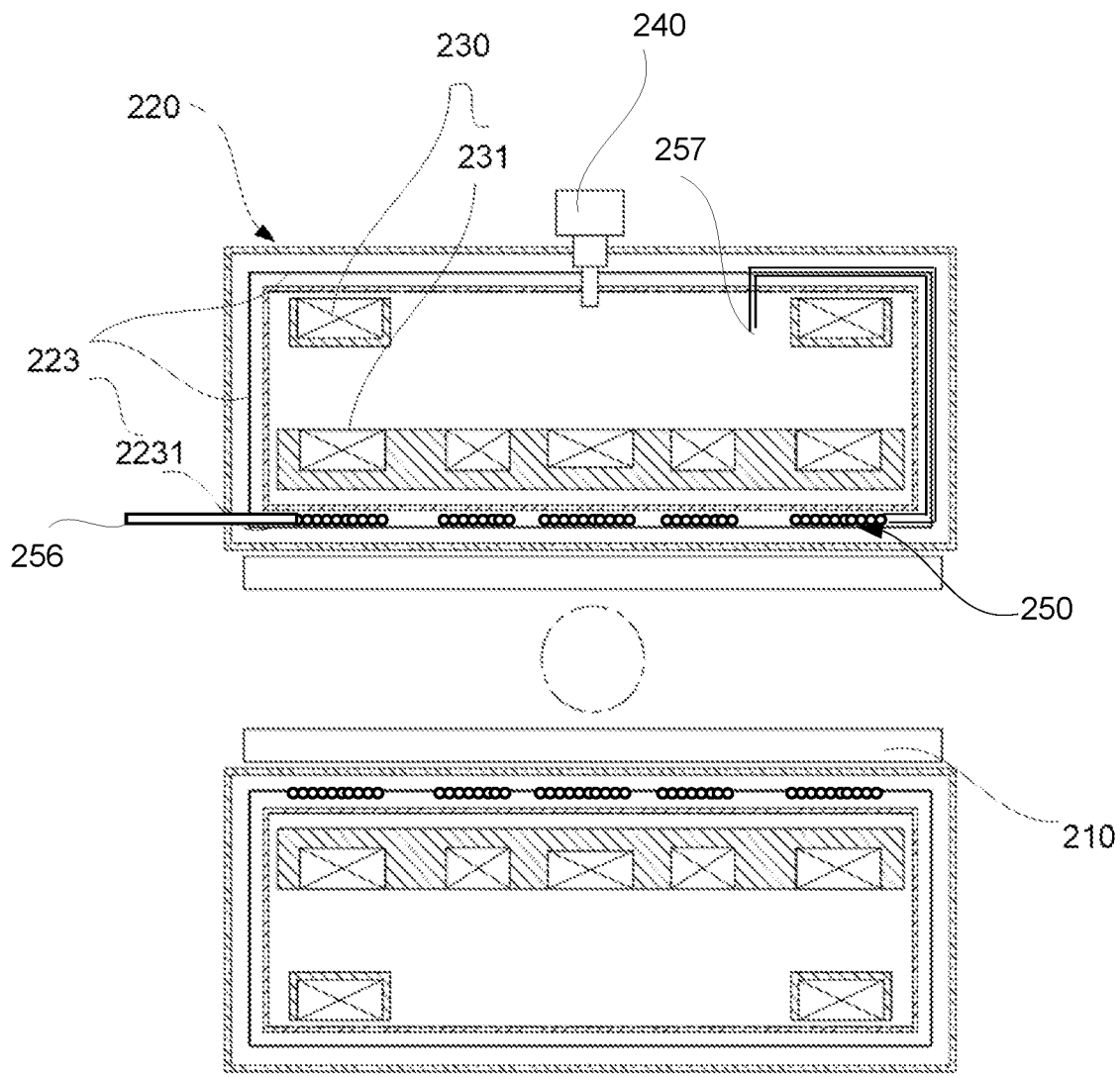
FIG. 2 is a schematic diagram illustrating a cross sectional view of an MRI system including an exemplary arrangement of a conductive shielding component according to some embodiments of the present disclosure, the conductive shielding component being arranged at intervals on an inner wall of a third outer side of an intermediate layer of a cryostat.

FIG. 2 is a schematic diagram illustrating a cross sectional view of an MRI system including an exemplary arrangement of a conductive shielding component 250 according to some embodiments of the present disclosure.

As shown in FIG. 2, a conductive shielding component 250 may be arranged at intervals on an inner wall of a third outer side 2231 of an intermediate layer 223 of a cryostat 220 facing one or more inner coils 231 of a superconducting coil assembly 230. Specifically, the conductive shielding component 250 may be wound at intervals on a circumference of the inner wall of the third outer side 2231 of the intermediate layer 223. The conductive shielding component 250 may include an inlet 256 and an outlet 257. The inlet 256 may be connected to an external refrigeration source or a refrigeration component 240. The outlet 257 may extend into the inner container 222. A cooling medium may flow from the inlet 256 to the outlet 257 via the conductive shielding component 250 to form a temperature-controllable cooling cycle pipeline.

The conductive shielding component 250 with the above arrangement may shield the superconducting coil assembly 230 from a stray field of the gradient coil assembly 210. In addition, a cooling medium (e.g., liquid helium) in the inner container 222 may be used to cool the cooling cycle pipeline (i.e., the conductive shielding component 250), thereby improving thermal stability of an MRI system.

Figure 3:
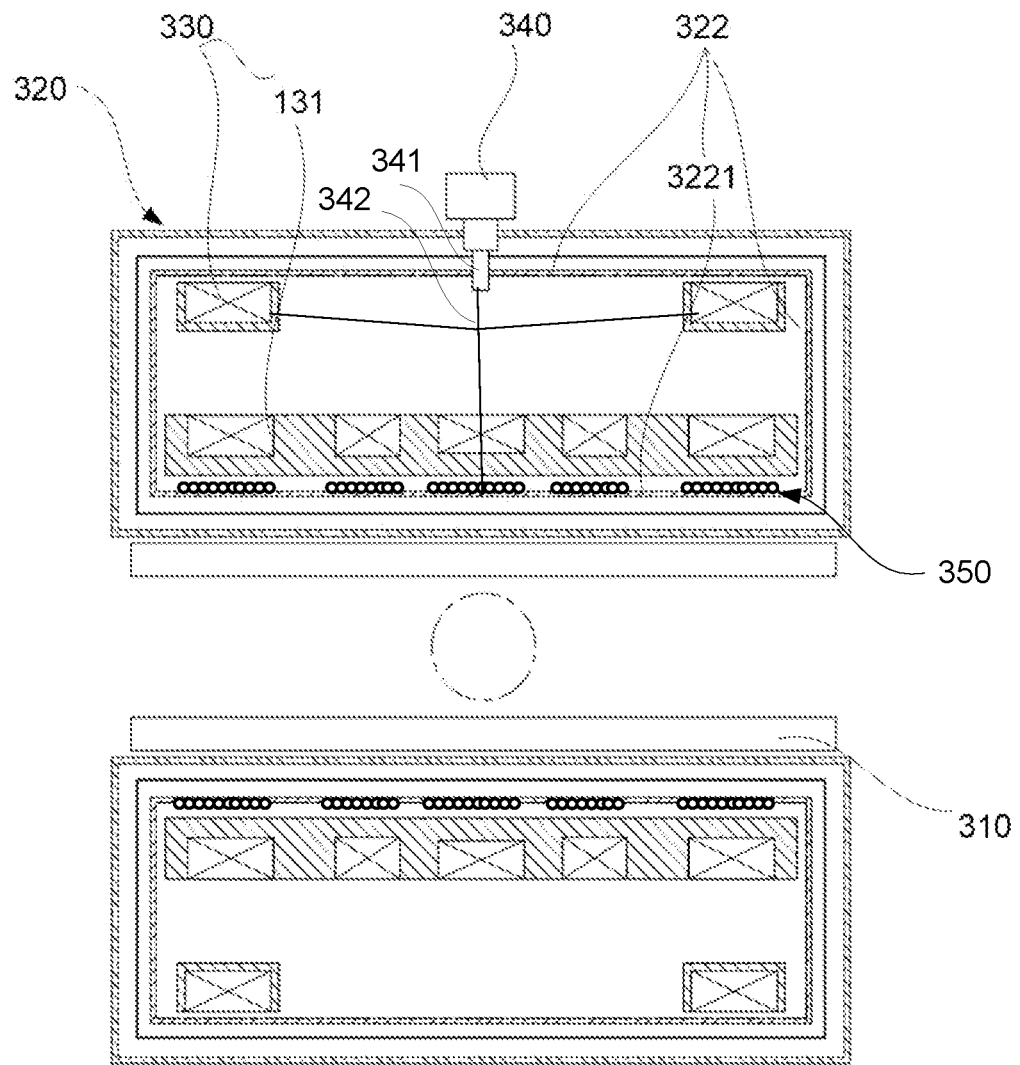
FIG. 3 is a schematic diagram illustrating a cross sectional view of an MRI system including an exemplary arrangement of a conductive shielding component according to some embodiments of the present disclosure, the conductive shielding component being arranged at intervals on an inner wall of a second outer side of an inner container of a cryostat.

FIG. 3 is a schematic diagram illustrating a cross sectional view of an MRI system including an exemplary arrangement of a conductive shielding component 350 according to some embodiments of the present disclosure. As shown in FIG. 3, a conductive shielding component 350 may be arranged at intervals on an inner wall of a second outer side 3221 of an inner container 322 of a cryostat 320 facing one or more inner coils 331 of a superconducting coil assembly 330. Specifically, the conductive shielding component 350 may be wound at intervals on a circumference of the inner wall of the second outer side 3221 of the inner container 322.

In some embodiments, when an MRI system uses low liquid helium or conduction cooling technology, the superconducting coil assembly 330 may be more sensitive to heat and eddy currents. In such cases, as shown in FIG. 3, a cold head 341 of a refrigeration component 340 may be connected to the superconducting coil assembly 330 via a heat conduction member 342 for cooling the superconducting coil assembly 330. Further, as shown in FIG. 3, the heat conduction member 342 may be connected to the conductive shielding component 350 for cooling the conductive shielding component 350.

The conductive shielding component 350 with the above arrangement may shield the superconducting coil assembly 330 from a stray field of the gradient coil assembly 310. In addition, the refrigeration component 340 may be used to cool the conductive shielding component 350, thereby improving thermal stability of the MRI system.

Figure 4:
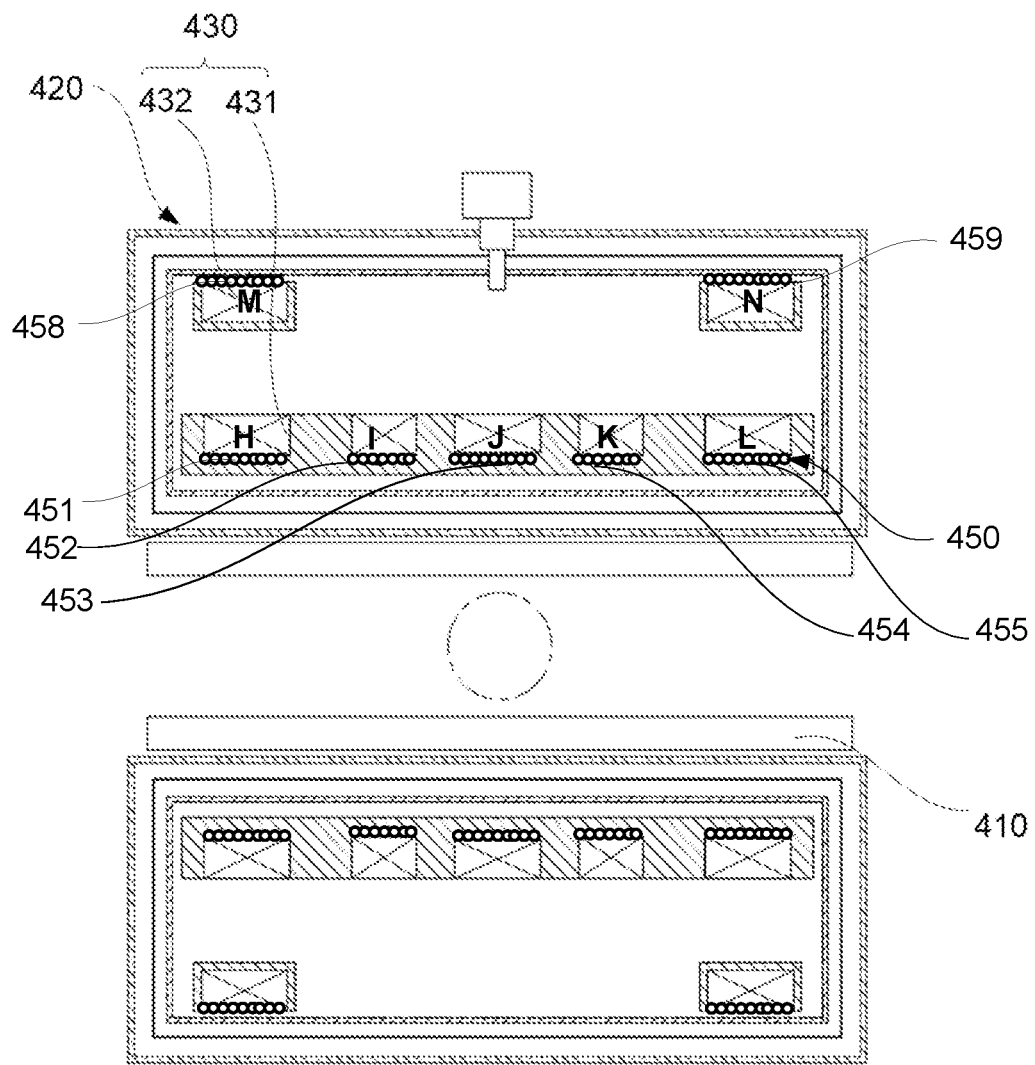
FIG. 4 is a schematic diagram illustrating a cross sectional view of an MRI system including an exemplary arrangement of a conductive shielding component according to some embodiments of the present disclosure, the conductive shielding component being arranged on one or more inner coils and/or one or more outer coils of a superconducting coil assembly.

FIG. 4 is a schematic diagram illustrating a cross sectional view of an MRI system including an exemplary arrangement of a conductive shielding component 450 according to some embodiments of the present disclosure.

In some embodiments, a conductive shielding component 450 may be arranged on/in a component of a cryostat 420. In some embodiments, the component of the cryostat 420 may include a superconducting coil assembly 430. The conductive shielding component 450 may be arranged on the superconducting coil assembly 430. As shown in FIG. 4, the superconducting coil assembly 430 may include one or more inner coils 431 (e.g., H, I, J, K, L) and one or more outer coils 432 (e.g., M, N). For at least one of the one or more inner coils 431 (e.g., H, I, J, K, L), a shielding unit (e.g., 451, 452, 453, 454, 455) may be arranged on an inner side of the at least one inner coil 431. As used herein, the inner side of an inner coil 431 may refer to a side of the inner coil 430 close to a gradient coil assembly 410.

In some embodiments, for at least one of the one or more outer coils 432 (e.g., M, N), a shielding unit (e.g., 458, 459) may be arranged on an outer side of the at least one outer coil 432. As used herein, the outer side of an outer coil 432 may refer to a side of the outer coil 432 away from the gradient coil assembly 410.

In some embodiments, for an inner coil 431 (or an outer coil 432), the shielding unit (e.g., a hollow copper pipe) may be wound on a circumference of the inner side of the inner coil 431 (or the outer side of the outer coil 432). The shielding unit (e.g., the hollow copper pipe) and the inner coil 431 (or the outer coil 432) may be poured with epoxy resin and heated and cured to form an integral structure, which may ensure the shielding unit and the inner coil 431 (or the outer coil 432) have a same thermal shrinkage rate. In such cases, a size of the shielding unit and the inner coil 431 (or the outer coil 432) is controllable, the manufacturing of the integral structure is convenient, and the integral structure has better mechanical strength and heat transfer characteristics. When the shielding unit and the inner coil 431 (or the outer coil 432) are cooled to an extremely low temperature together, the shielding unit has very good conductivity characteristics and a better shielding effect on a stray field of the gradient coil assembly 410.

Figure 5:
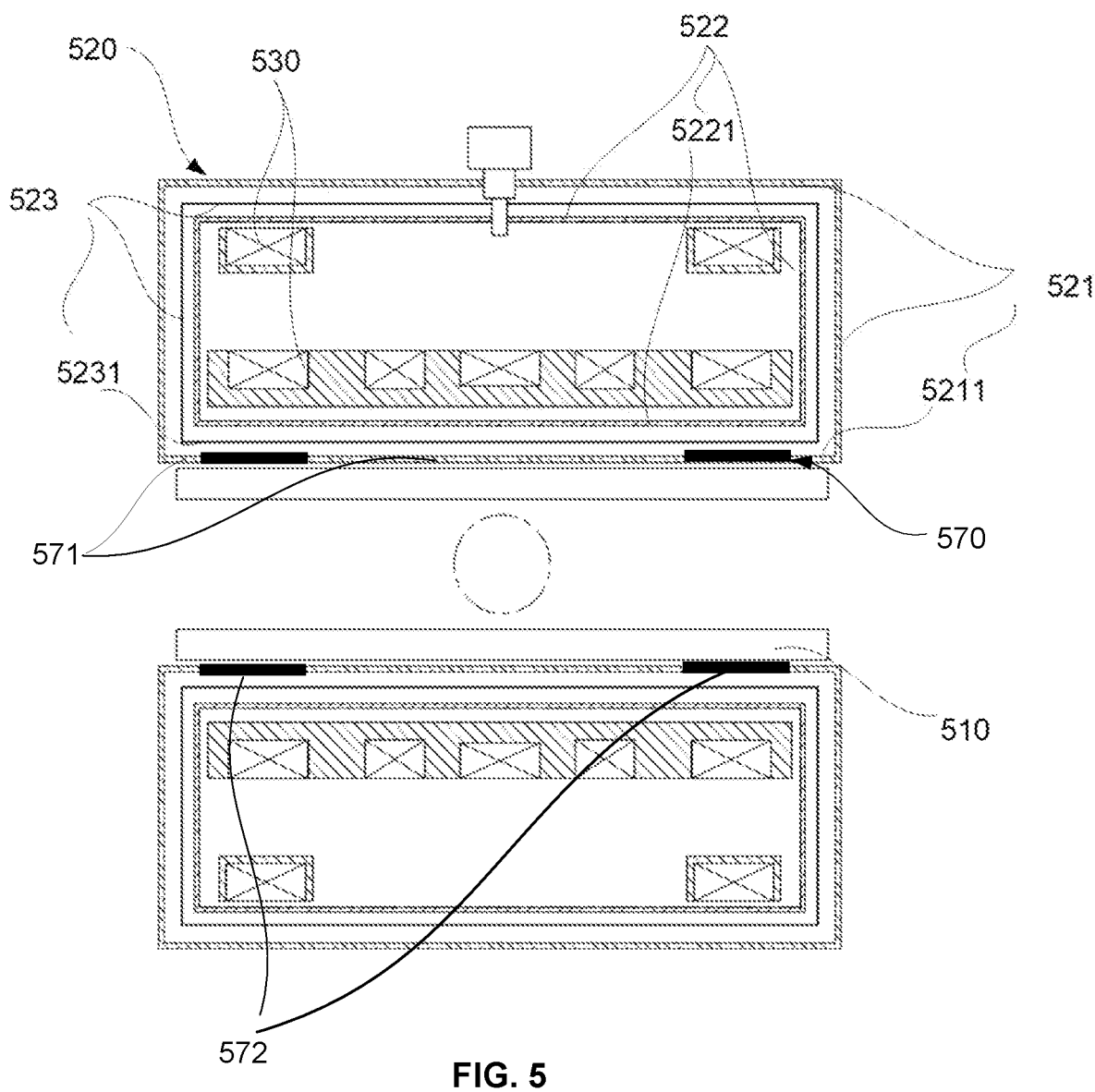
FIG. 5 is a schematic diagram illustrating a cross sectional view of an MRI system according to some embodiments of the present disclosure, a magnetic field shielding apparatus of the MRI system including a shielding cylinder that includes a mounting cylinder and a plurality of conductive components arranged on/in the mounting cylinder.

FIG. 5 is a schematic diagram illustrating a cross sectional view of an MRI system 500 according to some embodiments of the present disclosure. The MRI system 500 may include a gradient coil assembly 510 and a cryostat 520, etc. The cryostat 520 may include a superconducting coil assembly 530, an outer container 521, an inner container 522, and/or an intermediate layer 523 arranged between the outer container 521 and the inner container 522.

The cryostat 520 may further include a magnetic field shielding apparatus configured to shield the superconducting coil assembly 530 from a stray field of the gradient coil assembly 510, which may reduce or eliminate an eddy current formed by the stray field and a temperature rise of a component (e.g., the superconducting coil assembly 530, the skeleton, the outer container 521, the inner container 522, the intermediate layer 523) of the cryostat 520 caused by the eddy current, thereby ensuring the normal and stable operation of the MRI system 500. In some embodiments, the magnetic field shielding apparatus may include a shielding cylinder 570. In some embodiments, the shielding cylinder 570 may be arranged on/in components (e.g., volume transmit coil (VTC) cylinders, soundproof covers) close to a shimming region or other components that need to be shielded in the MRI system 500. In some embodiments, the shielding cylinder 570 may be arranged on/in the component of the cryostat 520. Specifically, the shielding cylinder 570 may be arranged on/in the outer container 521, the inner container 522, and/or the intermediate layer 523. For example, the shielding cylinder 570 may be arranged on/in a target side, close to the gradient coil assembly 510, of the outer container 521, the inner container 522, and/or the intermediate layer 523. The target side may include a first outer side 5211 of the outer container 521, a second outer side 5221 of the inner container 522, and/or a third outer side 5231 of the intermediate layer 523.

As shown in FIG. 5, the shielding cylinder 570 may include a mounting cylinder 571 and a plurality of conductive components 572 arranged on/in the mounting cylinder 570. The mounting cylinder 571 may include the target side of the outer container 521, the inner container 522, and/or the intermediate layer 523. For example, the mounting cylinder 571 may be the first outer side 5211 of the outer container 521. As another example, the mounting cylinder 571 may be the second outer side 5221 of the inner container 522. As a further example, the mounting cylinder 571 may be the third outer side 5231 of the intermediate layer 523. The plurality of conductive components 572 may have good electrical conductivity and shield the stray field of the gradient coil assembly 510, which may reduce a temperature rise of the superconducting coil assembly 530 caused by the eddy current, thereby reducing the volatilization of cooling medium (e.g., liquid helium) and a quench of the superconducting coil assembly 530. In some embodiments, the plurality of conductive components 572 may be machined from a metal plate.

In some embodiments, a conductivity of each of the plurality of conductive components 572 may exceed a conductivity of the mounting cylinder 571, so that an eddy current formed by the stray field is mainly concentrated on the plurality of conductive components 572, which can ensure that the plurality of conductive components 572 shields most of the stray field. Specifically, the plurality of conductive components 572 may be made of aluminum, copper, etc., or materials with good electrical conductivity. Compared with the plurality of conductive components 572, the mounting cylinder 571 may be made of materials with poorer conductivity, such as stainless steel, carbon steel, or glass-reinforced plastics (GRP).

In some embodiments, a thickness of each of the plurality of conductive components 572 may be in a range of 0.5-10 mm. A thickness of the mounting cylinder 571 may be equal to the target side of the outer container 521, the inner container 522, or the intermediate layer 523, that is, there is no need to increase the thickness of the mounting cylinder 571 compared to the target side, which means that an original design of the MRI system 500 does not need to be changed, does not increase cost, and does not affect the installation of the gradient coil assembly 510.

In some embodiments, compared to other positions of the mounting cylinder 571, the stray field at positions close to two ends of the mounting cylinder 571 is higher. Compared to other coils of the superconducting coil assembly 530, stability of coils of the superconducting coil assembly 530 close to the two ends of the cryostat 520 are relatively poor and need more shielding protection. Therefore, the plurality of conductive components 572 may be arranged at the positions close to the two ends of the mounting cylinder 571, which can prevent a strong coupling effect between the plurality of conductive components 572 and the gradient coil assembly 510, thereby avoiding an abnormality of the gradient coil assembly 510 caused by the coupling effect.

For illustration purposes, the present disclosure is described with reference to the shielding cylinder 570 arranged on/in the first outer side 5211 of the outer container 521. The shielding cylinder applied to other components of the MRI system 500 is similar to the shielding cylinder 570 applied to the cryostat 520, and relevant descriptions are not repeated here.

Figure 6B:
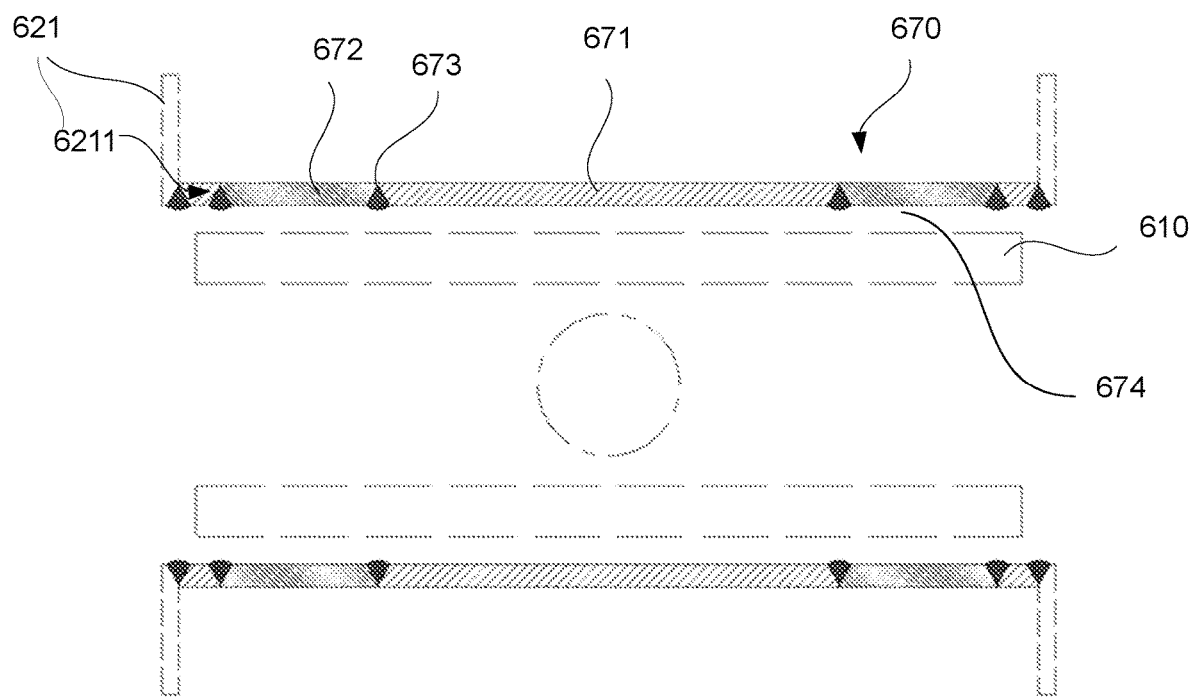
FIG. 6B is a schematic diagram illustrating a cross sectional view of the shielding cylinder of FIG. 6A, with a plurality of conductive components of the shielding cylinder each of which is in a sheet shape being mounted at intervals in through slots on a mounting cylinder along a circumferential direction of the mounting cylinder.
Figure 6A:
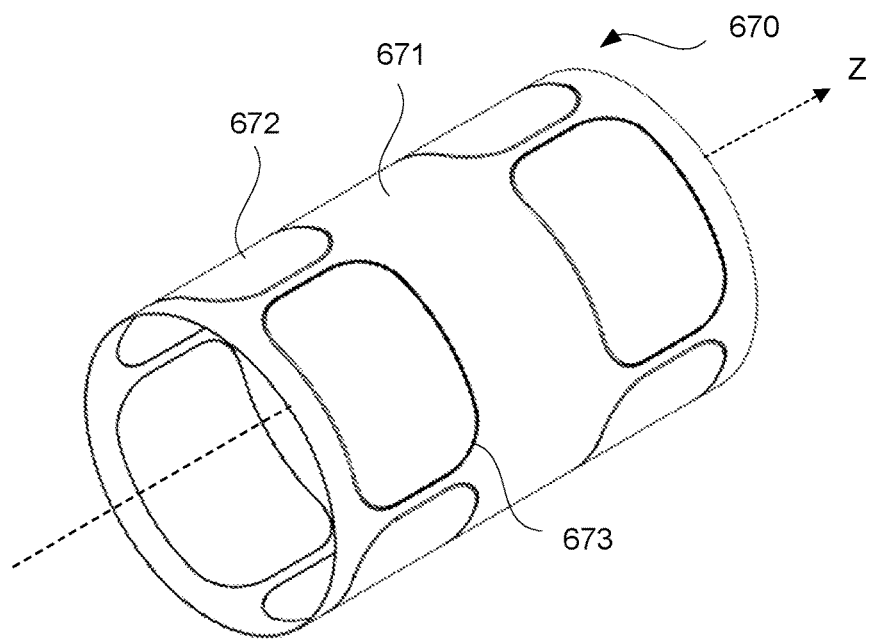
FIG. 6A is a schematic diagram illustrating a front perspective view of a shielding cylinder according to some embodiments of the present disclosure, a plurality of conductive components of the shielding cylinder each of which is in a sheet shape being mounted at intervals in through slots on a mounting cylinder along a circumferential direction of the mounting cylinder.

FIG. 6A is a schematic diagram illustrating a front perspective view of a shielding cylinder 670 according to some embodiments of the present disclosure. FIG. 6B is a schematic diagram illustrating a cross sectional view of the shielding cylinder 670 of FIG. 6A.

As shown in FIGS. 6A-B, a shielding cylinder 670 may include a mounting cylinder 671 and a plurality of conductive components 672 arranged in the mounting cylinder 670. As shown in FIG. 6A, the mounting cylinder 671 may be a hollow cylindrical cavity extending in an axial direction Z. In some embodiments, the mounting cylinder 671 may be a first outer side 6211 of an outer container 621 of a cryostat (not shown). Components (e.g., a superconducting coil assembly (not shown), an inner container (not shown), an intermediate layer (not shown)) of the cryostat may be arranged in the hollow cylindrical cavity of the mounting cylinder 671. A gradient coil assembly 610 may be arranged on a radially inner side of the mounting cylinder 671. The plurality of conductive components 672 may be mounted in the mounting cylinder 671 and the mounting cylinder 671 may support the plurality of conductive components 672. The gradient coil assembly 610 and the superconducting coil assembly (not shown) may be separated by the shielding cylinder 670 so that the plurality of conductive components 672 may shield the superconducting coil assembly 130 from a stray field of the gradient coil assembly 610, which may reduce an eddy current formed by the stray field and a temperature rise of the superconducting coil assembly caused by the eddy current, thereby reducing the volatilization of cooling medium (e.g., liquid helium) and a quench of the superconducting coil assembly and ensuring the normal and stable operation of the MRI system.

In some embodiments, the mounting cylinder 671 may be divided into a middle region and two end regions along the axial direction Z. For example, the mounting cylinder 671 may be divided into three regions (i.e., the middle region and the two end regions) evenly along the axial direction Z. The plurality of conductive components 672 may be arranged in the two end regions. Specifically, as shown in FIG. 6A, the plurality of conductive components 672 may be arranged at intervals in the two end regions along a circumferential direction of the mounting cylinder 671.

In some embodiments, the mounting cylinder 671 may include a plurality of mounting slots 674. Each of the plurality of conductive components 672 may be arranged in one of the plurality of mounting slots 674. A shape of a mounting slot 674 may be consistent with a shape of a conductive component 672 so that the conductive component 672 may be embedded in the mounting slot 674. In some embodiments, the plurality of mounting slots 674 may include through slots. A through slot 674 may refer to a slot that penetrates the mounting cylinder 671 in a radial direction. A depth of the through slot 674 may be equal to a thickness of the mounting cylinder 671.

In some embodiments, a conductive component 672 may be embedded in a mounting slot 674 by a physical or chemical connection manner. Merely by way of example, the shielding cylinder 670 may also include a plurality of mounting joints 673, the plurality of conductive components 672 may be mounted on the mounting cylinder 671 by the plurality of mounting joints 673. The plurality of mounting joints 673 may ensure that the mounting cylinder 671 and the plurality of conductive components 672 have good mechanical properties and sealing properties. Exemplary mounting joint 673 may include a composite joint of stainless steel and copper that is manufactured by brazing and special solder, a composite joints of composite fiber material and copper that is manufactured by resin impregnation and curing, or other composite joints made of materials that can ensure mechanical properties and sealing properties.

In some embodiments, each of the plurality of conductive components 672 may be in a sheet shape. When each of the plurality of conductive components 672 is in the sheet shape, the plurality of conductive components 672 may be arranged at intervals along a circumferential direction of the mounting cylinder 671.

As shown in FIGS. 6A-B, the plurality of mounting slots 674 may be through slots and the plurality of conductive components 672 each of which is in the sheet shape may be mounted at intervals in the through slots 674 by the plurality of mounting joints 673 along a circumferential direction of the mounting cylinder 671.

Figure 7B:
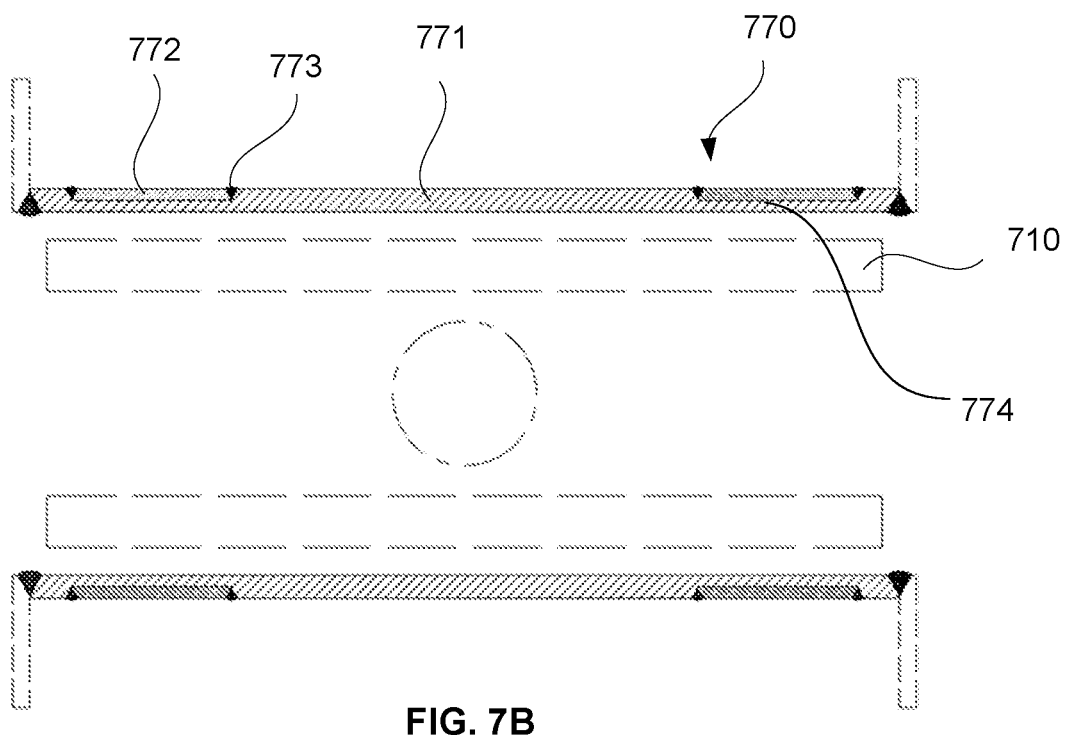
FIG. 7B is a schematic diagram illustrating a cross sectional view of the shielding cylinder of FIG. 7A, with a plurality of conductive components of the shielding cylinder each of which is in a sheet shape being mounted at intervals in blind slots on an outer wall of a mounting cylinder along a circumferential direction of the mounting cylinder.
Figure 7A:
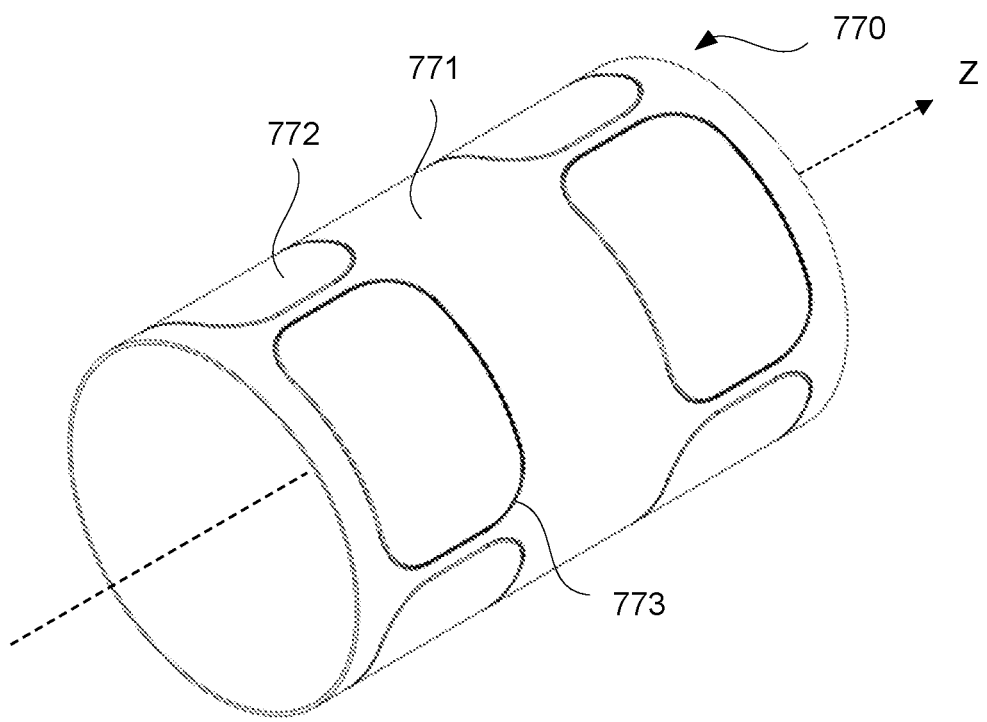
FIG. 7A is a schematic diagram illustrating a front perspective view of a shielding cylinder according to some embodiments of the present disclosure, a plurality of conductive components of the shielding cylinder each of which is in a sheet shape being mounted at intervals in blind slots on an outer wall of a mounting cylinder along a circumferential direction of the mounting cylinder.

FIG. 7A is a schematic diagram illustrating a front perspective view of a shielding cylinder 770 according to some embodiments of the present disclosure. FIG. 7B is a schematic diagram illustrating a cross sectional view of the shielding cylinder 770 of FIG. 7A.

In some embodiments, a plurality of mounting slots 774 may include blind slots. A blind slot 774 may refer to a slot that does not penetrate a mounting cylinder 771 in a radial direction. A depth of the blind slot 774 may be less than a thickness of the mounting cylinder 771. In some embodiments, when the plurality of mounting slots 774 are blind slots, each of the blind slots may be located on an outer wall of the mounting cylinder 771, which may facilitate the processing of the mounting slots 774 and reduce a manufacturing cost. The outer wall of the mounting cylinder 771 may refer to a wall away from a gradient coil assembly 710. Correspondingly, a plurality of conductive components 772 may be arranged on the outer wall of the mounting cylinder 771, which does not increase the thickness of the mounting cylinder 771. Compared with the through slots, a shielding effect of the plurality of conductive components 772 arranged on the blind slots on a stray field of the gradient coil assembly 710 is not weakened, and a depth of each of the blind slots and a thickness of each of the plurality of conductive components 772 arranged on the blind slots are reduced.

As shown in FIGS. 7A-B, the plurality of mounting slots 774 may be blind slots and the plurality of conductive components 772 each of which is in a sheet shape may be mounted at intervals in the blind slots 774 on the outer wall of the mounting cylinder 771 by a plurality of mounting joints 773 along a circumferential direction of the mounting cylinder 771.

Figure 8B:
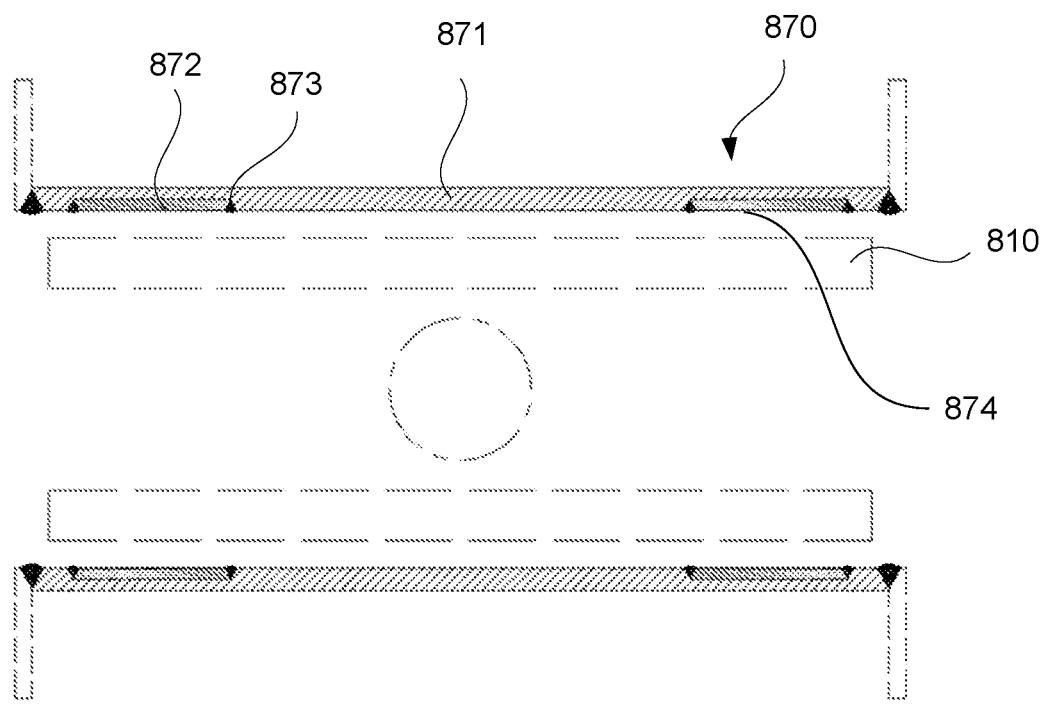
FIG. 8B is a schematic diagram illustrating a cross sectional view of the shielding cylinder of FIG. 8A, with a plurality of conductive components of the shielding cylinder each of which is in a sheet shape being mounted at intervals in blind slots on an inner wall of a mounting cylinder along a circumferential direction of the mounting cylinder.
Figure 8A:
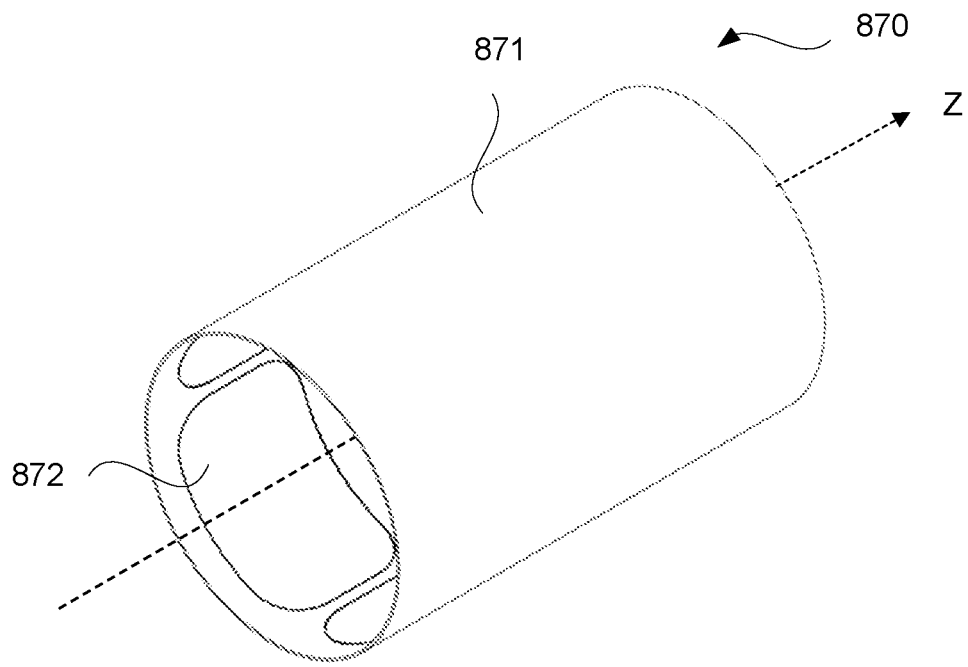
FIG. 8A is a schematic diagram illustrating a front perspective view of a shielding cylinder according to some embodiments of the present disclosure, a plurality of conductive components of the shielding cylinder each of which is in a sheet shape being mounted at intervals in blind slots on an inner wall of a mounting cylinder along a circumferential direction of the mounting cylinder.

FIG. 8A is a schematic diagram illustrating a front perspective view of a shielding cylinder 870 according to some embodiments of the present disclosure. FIG. 8B is a schematic diagram illustrating a cross sectional view of the shielding cylinder 870 of FIG. 8A.

In some embodiments, when a plurality of mounting slots 874 are blind slots, each of the blind slots 874 may be located on an inner wall of a mounting cylinder 871. The inner wall of the mounting cylinder 871 may refer to a wall close to a gradient coil assembly 810. Correspondingly, a plurality of conductive components 872 may be arranged on the inner wall of the mounting cylinder 871. In such cases, for each of the plurality of conductive components 872, an atmospheric pressure that the conductive component 872 bears is reduced so that a connection between the conductive component 872 and the mounting cylinder 871 does not require airtightness. Therefore, the conductive component 872 and the mounting cylinder 871 may be fixed by simple manners such as bonding, spot welding, and screws, etc.

As shown in FIGS. 8A-B, the plurality of mounting slots 874 may be blind slots and the plurality of conductive components 872 each of which is in a sheet shape may be mounted at intervals in the blind slots 874 on the inner wall of the mounting cylinder 871 by a plurality of mounting joints 873 along a circumferential direction of the mounting cylinder 871.

Figure 9B:
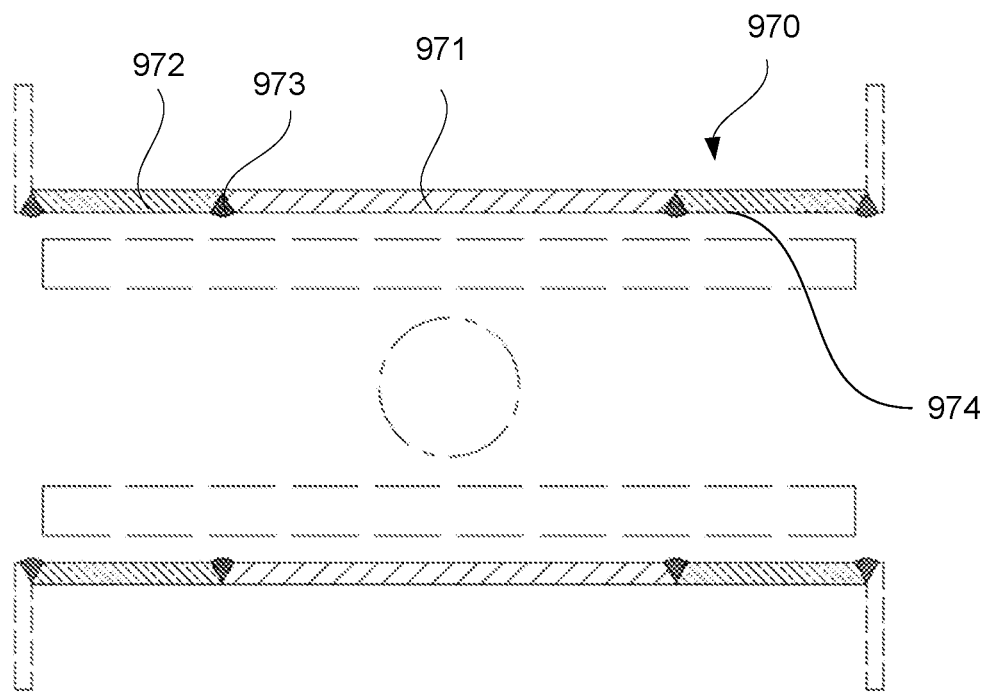
FIG. 9B is a schematic diagram illustrating a cross sectional view of the shielding cylinder of FIG. 9A, with two conductive components of the shielding cylinder each of which is in a ring shape being respectively fixed at two ends of a mounting cylinder.
Figure 9A:
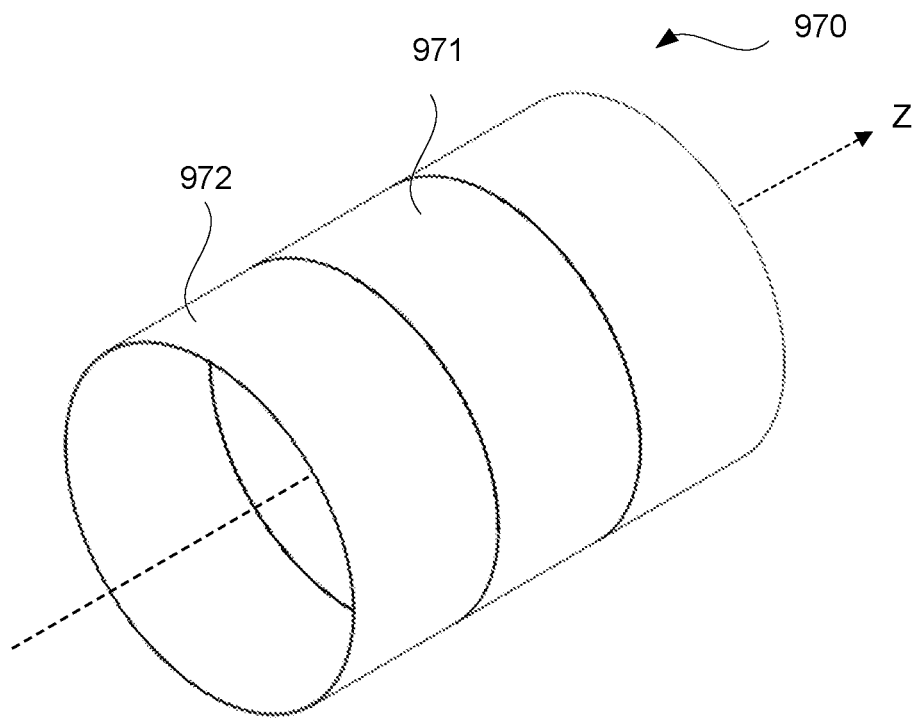
FIG. 9A is a schematic diagram illustrating a front perspective view of a shielding cylinder according to some embodiments of the present disclosure, two conductive components of the shielding cylinder each of which is in a ring shape being respectively fixed at two ends of a mounting cylinder.

FIG. 9A is a schematic diagram illustrating a front perspective view of a shielding cylinder 970 according to some embodiments of the present disclosure. FIG. 9B is a schematic diagram illustrating a cross sectional view of the shielding cylinder 970 of FIG. 9A.

In some embodiments, each of a plurality of conductive components 972 may be in a ring shape. When each of the plurality of conductive components 972 is in the ring shape, a count of the plurality of conductive components 972 may be two. The two conductive components 972 may be respectively arranged at two ends of the mounting cylinder 971 to increase an axial length of the mounting cylinder 971. When a conductive component 972 is in the ring shape, a shape of the conductive component 972 may be consistent with a shape of the mounting cylinder 971, which may facilitate the forming and processing of the conductive component 972 and reduce the manufacturing cost.

As shown in FIGS. 9 A-B, a plurality of mounting slots 974 may be through slots and two conductive components 972 each of which is in the ring shape may be respectively fixed at two ends of the mounting cylinder 971 by a plurality of mounting joints 973.

Figure 10B:
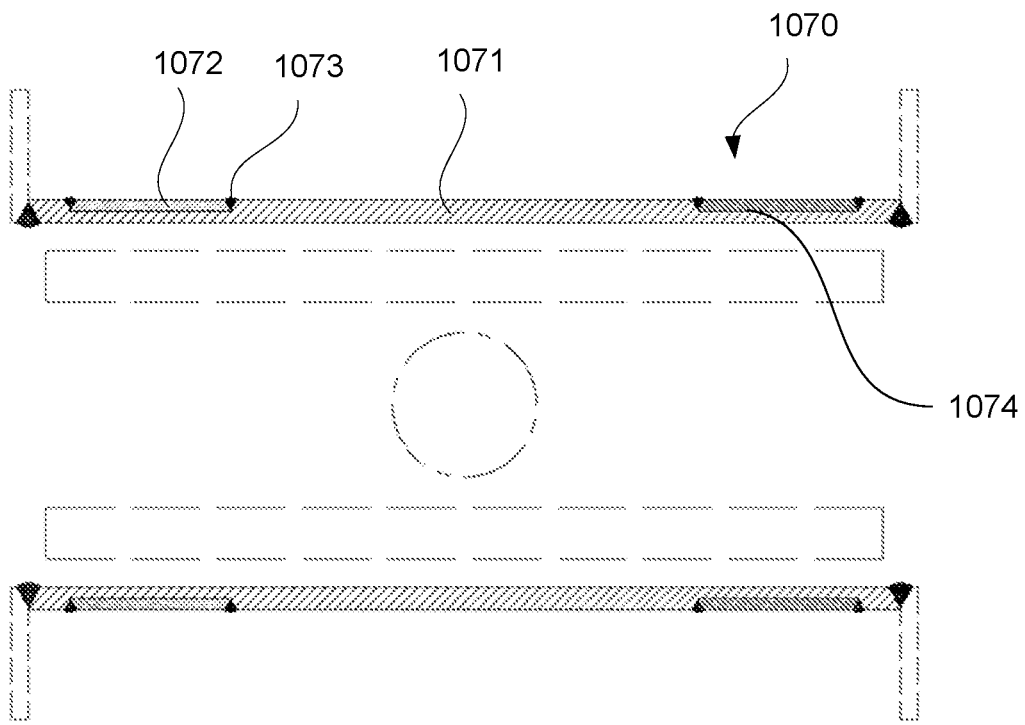
FIG. 10B is a schematic diagram illustrating a cross sectional view of the shielding cylinder of FIG. 10A, with two conductive components of the shielding cylinder each of which is in a ring shape being respectively mounted in blind slots on an outer wall of a mounting cylinder at positions close to two ends of the mounting cylinder.
Figure 10A:
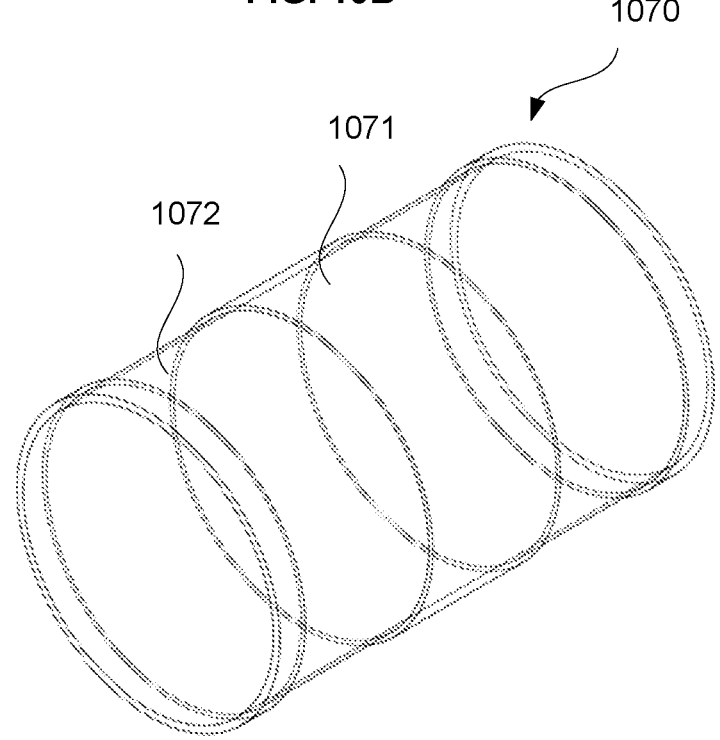
FIG. 10A is a schematic diagram illustrating a front perspective view of a shielding cylinder according to some embodiments of the present disclosure, two conductive components of the shielding cylinder each of which is in a ring shape being respectively mounted in blind slots on an outer wall of a mounting cylinder at positions close to two ends of the mounting cylinder.

FIG. 10A is a schematic diagram illustrating a front perspective view of a shielding cylinder 1070 according to some embodiments of the present disclosure. FIG. 10B is a schematic diagram illustrating a cross sectional view of the shielding cylinder 1070 of FIG. 10A.

As shown in FIGS. 10A-B, a plurality of mounting slots 1074 may be blind slots. There is a certain distance between a blind slot 1074 and a corresponding end of a mounting cylinder 1071. Two conductive components 1072 each of which is in a ring shape may be respectively mounted, by a plurality of mounting joints 1073, in the blind slots 1074 on an outer wall of the mounting cylinder 1071 at positions close to two ends of the mounting cylinder 1071.

Figure 11B:
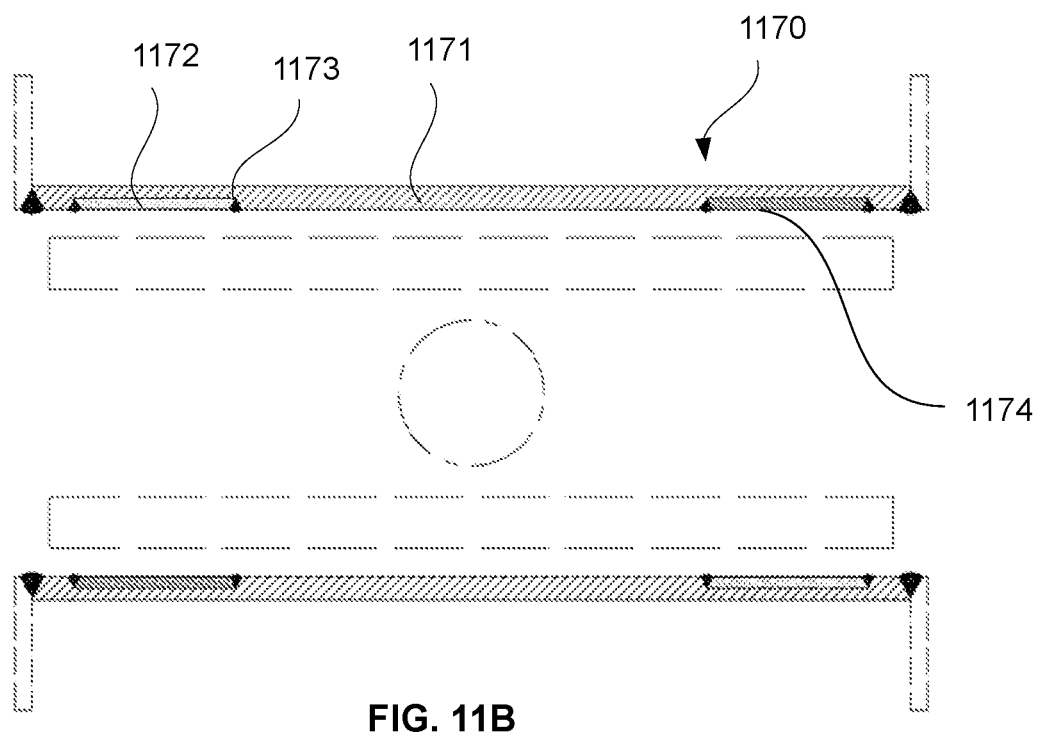
FIG. 11B is a schematic diagram illustrating a cross sectional view of the shielding cylinder of FIG. 11A, with two conductive components of the shielding cylinder each of which is in a ring shape being respectively mounted in blind slots on an inner wall of a mounting cylinder at positions close to two ends of the mounting cylinder.
Figure 11A:
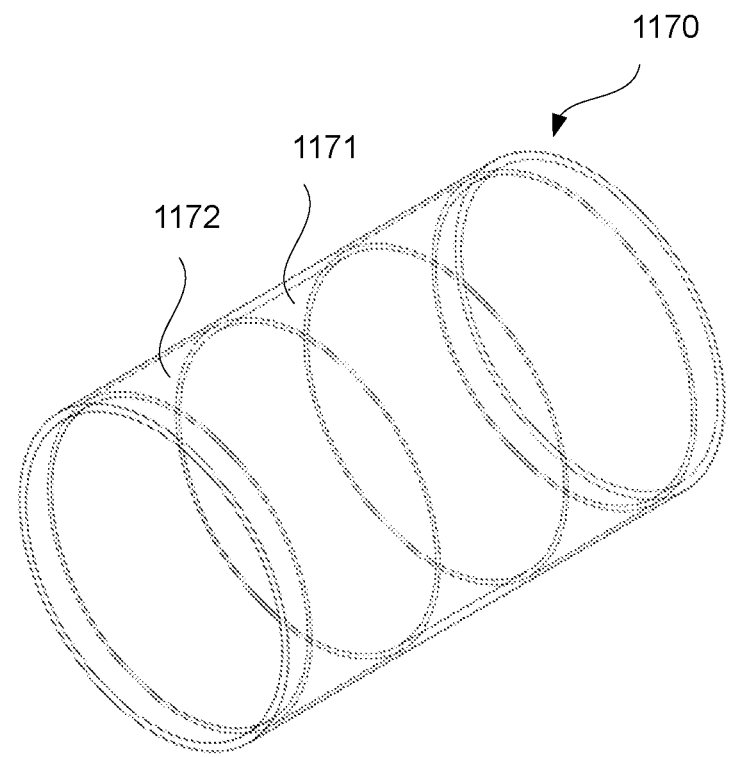
FIG. 11A is a schematic diagram illustrating a front perspective view of a shielding cylinder according to some embodiments of the present disclosure, two conductive components of the shielding cylinder each of which is in a ring shape being respectively mounted in blind slots on an inner wall of a mounting cylinder at positions close to two ends of the mounting cylinder.

FIG. 11A is a schematic diagram illustrating a front perspective view of a shielding cylinder 1170 according to some embodiments of the present disclosure. FIG. 11B is a schematic diagram illustrating a cross sectional view of the shielding cylinder 1170 of FIG. 11A.

As shown in FIGS. 11A-B, a plurality of mounting slots 1174 may be blind slots. There is a certain distance between a blind slot 1174 and a corresponding end of a mounting cylinder 1171. Two conductive components 1172 each of which is in a ring shape may be respectively mounted, by a plurality of mounting joints 1173, in the blind slots 1174 on an inner wall of the mounting cylinder 1171 at positions close to two ends of the mounting cylinder 1171.

Figure 12B:
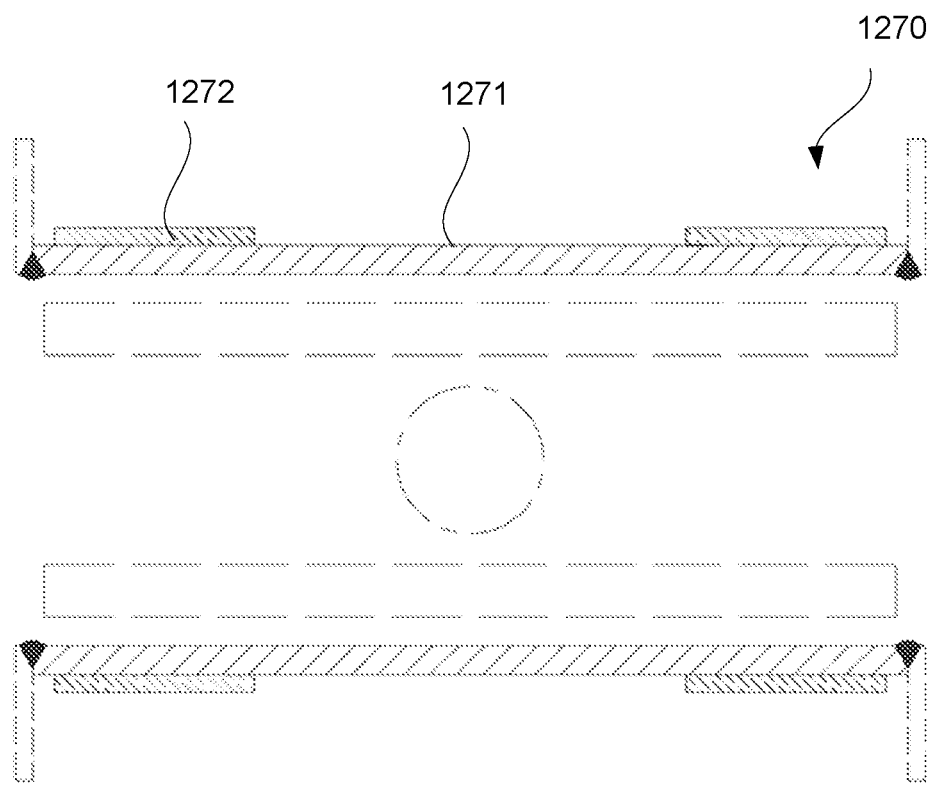
FIG. 12B is a schematic diagram illustrating a cross sectional view of the shielding cylinder of FIG. 12A, with a plurality of conductive components of the shielding cylinder each of which is in a sheet shape being attached to an outer wall of a mounting cylinder and arranged at intervals along a circumferential direction of the mounting cylinder.
Figure 12A:
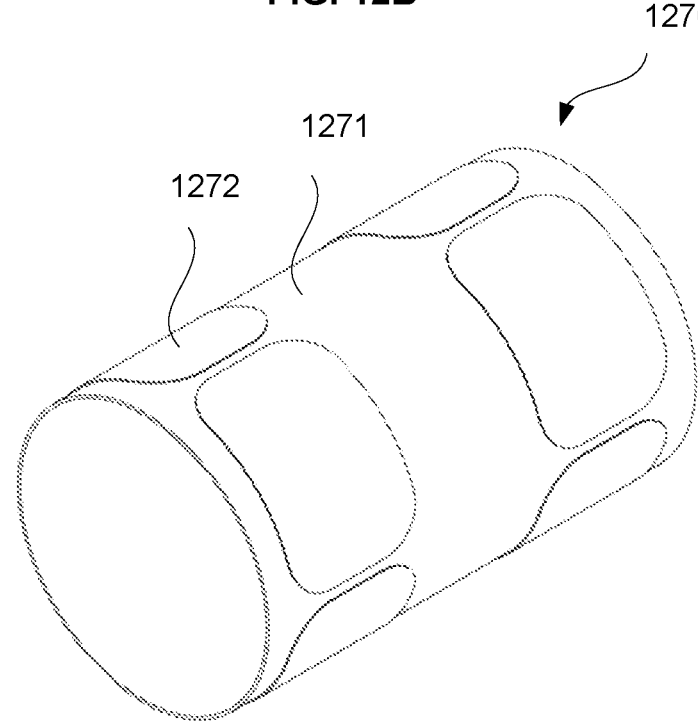
FIG. 12A is a schematic diagram illustrating a front perspective view of a shielding cylinder according to some embodiments of the present disclosure, a plurality of conductive components of the shielding cylinder each of which is in a sheet shape being attached to an outer wall of a mounting cylinder and arranged at intervals along a circumferential direction of the mounting cylinder.

FIG. 12A is a schematic diagram illustrating a front perspective view of a shielding cylinder 1270 according to some embodiments of the present disclosure. FIG. 12B is a schematic diagram illustrating a cross sectional view of the shielding cylinder 1270 of FIG. 12A.

In some embodiments, a plurality of conductive components 1272 may be attached to an outer wall and/or an inner wall of a mounting cylinder 1271. For example, the plurality of conductive components 1272 may be fixed on the outer wall and/or the inner wall of the mounting cylinder 1271 by pasting, welding, etc. In some embodiments, the plurality of conductive components 1272 may be in a sheet shape and/or a ring shape.

As shown in FIGS. 12A-B, the plurality of conductive components 1272 each of which is in the sheet shape may be attached to the outer wall of the mounting cylinder 1271 and arranged at intervals along a circumferential direction of the mounting cylinder 1271.

Figure 13B:
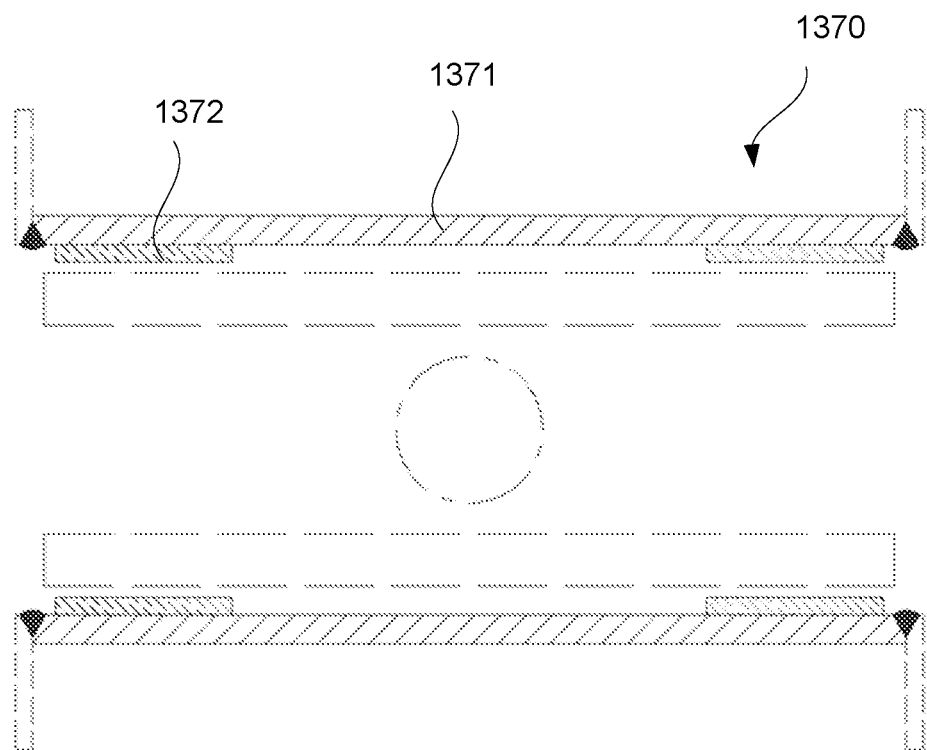
FIG. 13B is a schematic diagram illustrating a cross sectional view of the shielding cylinder of FIG. 13A, with a plurality of conductive components of the shielding cylinder each of which is in a sheet shape being attached to an inner wall of a mounting cylinder and arranged at intervals along a circumferential direction of the mounting cylinder.
Figure 13A:
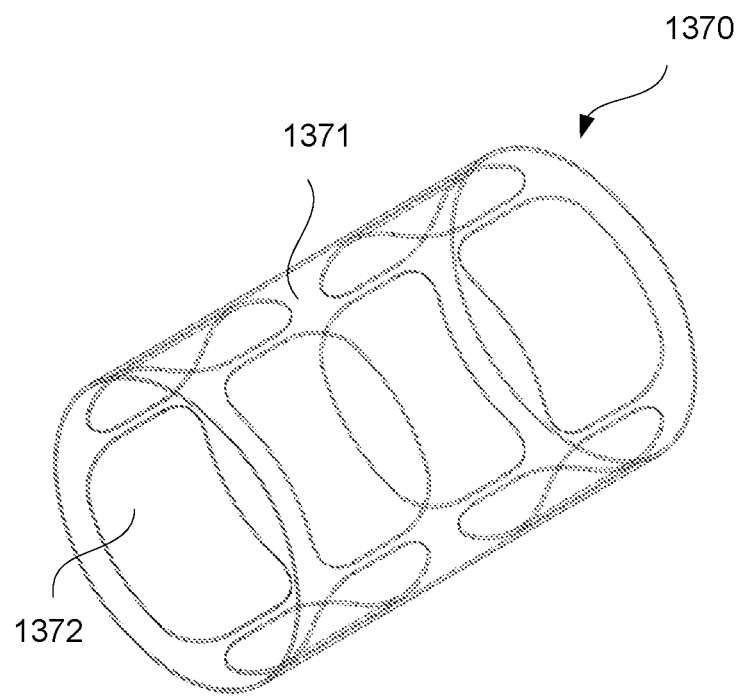
FIG. 13A is a schematic diagram illustrating a front perspective view of a shielding cylinder according to some embodiments of the present disclosure, a plurality of conductive components of the shielding cylinder each of which is in a sheet shape being attached to an inner wall of a mounting cylinder and arranged at intervals along a circumferential direction of the mounting cylinder.

FIG. 13A is a schematic diagram illustrating a front perspective view of a shielding cylinder 1370 according to some embodiments of the present disclosure. FIG. 13B is a schematic diagram illustrating a cross sectional view of the shielding cylinder 1370 of FIG. 13A. As shown in FIGS. 13A-B, a plurality of conductive components 1372 each of which is in a sheet shape may be attached to an inner wall of a mounting cylinder 1371 and arranged at intervals along a circumferential direction of the mounting cylinder 1371.

Figure 14B:
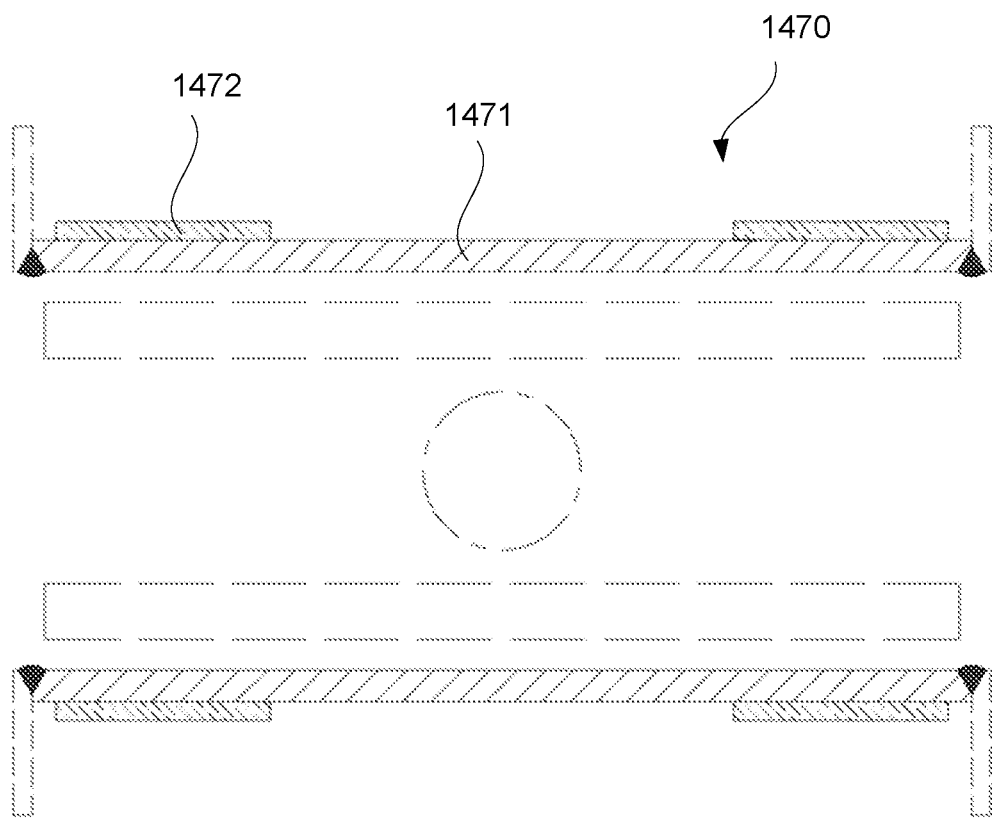
FIG. 14B is a schematic diagram illustrating a cross sectional view of the shielding cylinder of FIG. 14A, with two conductive components of the shielding cylinder each of which is in a ring shape being attached to an outer wall of a mounting cylinder and respectively fixed at positions close to two ends of the mounting cylinder.
Figure 14A:
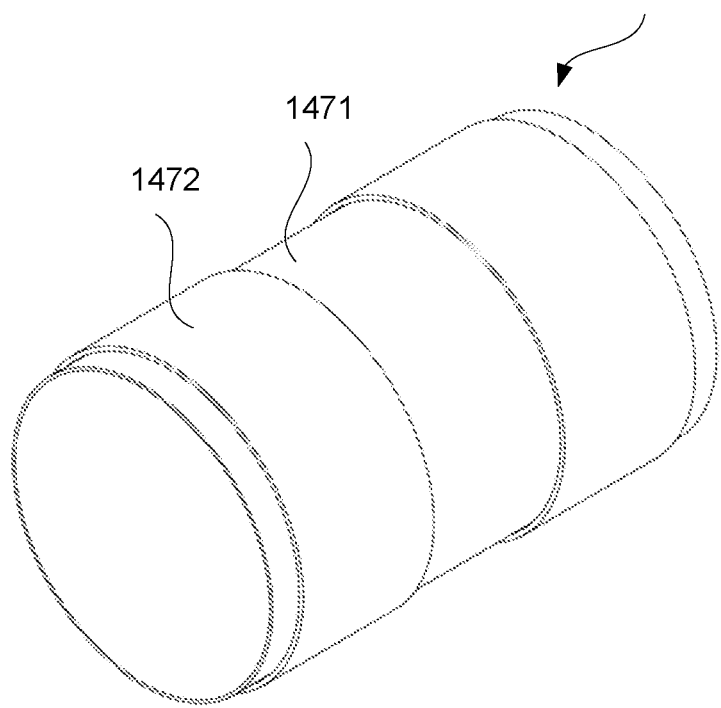
FIG. 14A is a schematic diagram illustrating a front perspective view of a shielding cylinder according to some embodiments of the present disclosure, two conductive components of the shielding cylinder each of which is in a ring shape being attached to an outer wall of a mounting cylinder and respectively fixed at positions close to two ends of the mounting cylinder.

FIG. 14A is a schematic diagram illustrating a front perspective view of a shielding cylinder 1470 according to some embodiments of the present disclosure. FIG. 14B is a schematic diagram illustrating a cross sectional view of the shielding cylinder 1470 of FIG. 14A. As shown in FIGS.

14A-B, two conductive components 1472 each of which is in a ring shape may be attached to an outer wall of a mounting cylinder 1471 and respectively fixed at positions close to two ends of the mounting cylinder 1471.

Figure 15B:
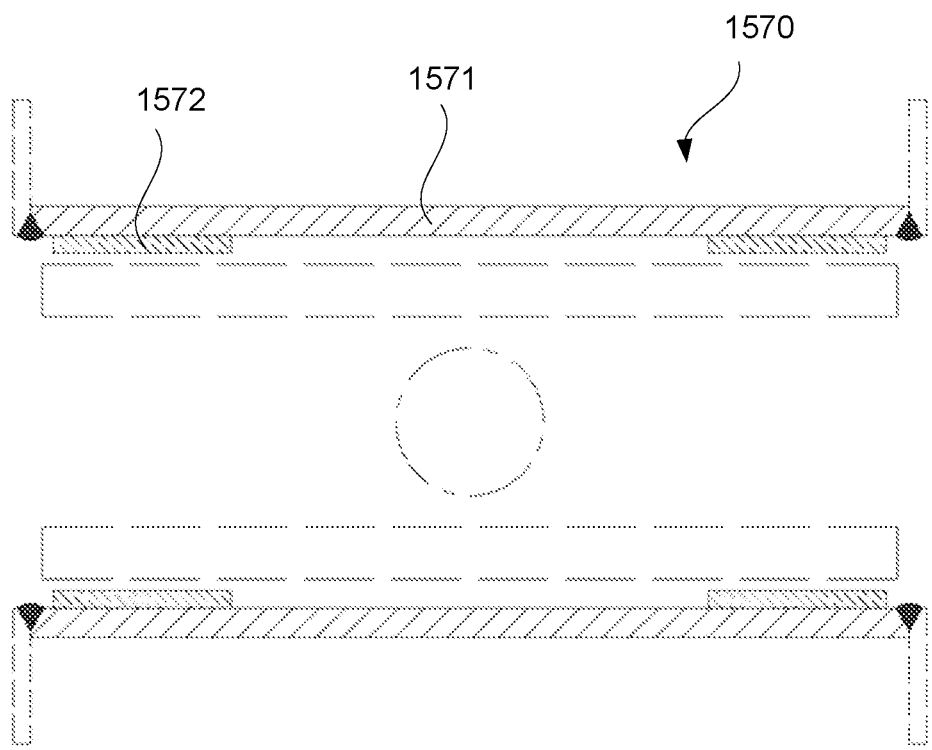
FIG. 15B is a schematic diagram illustrating a cross sectional view of the shielding cylinder of FIG. 15A, with two conductive components of the shielding cylinder each of which is in a ring shape being attached to an inner wall of a mounting cylinder and respectively fixed at positions close to two ends of the mounting cylinder.
Figure 15A:
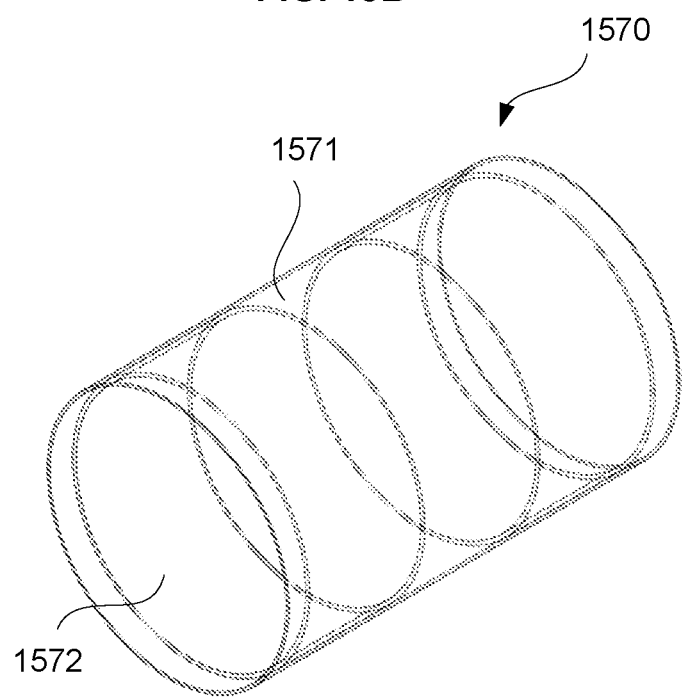
FIG. 15A is a schematic diagram illustrating a front perspective view of a shielding cylinder according to some embodiments of the present disclosure, two conductive components of the shielding cylinder each of which is in a ring shape being attached to an inner wall of a mounting cylinder and respectively fixed at positions close to two ends of the mounting cylinder.

FIG. 15A is a schematic diagram illustrating a front perspective view of a shielding cylinder 1570 according to some embodiments of the present disclosure. FIG. 15B is a schematic diagram illustrating a cross sectional view of the shielding cylinder 1570 of FIG. 15A. As shown in FIGS. 15A-B, two conductive components 1572 each of which is in a ring shape may be attached to an inner wall of a mounting cylinder 1571 and respectively fixed at positions close to two ends of the mounting cylinder 1571.

Figure 16B:
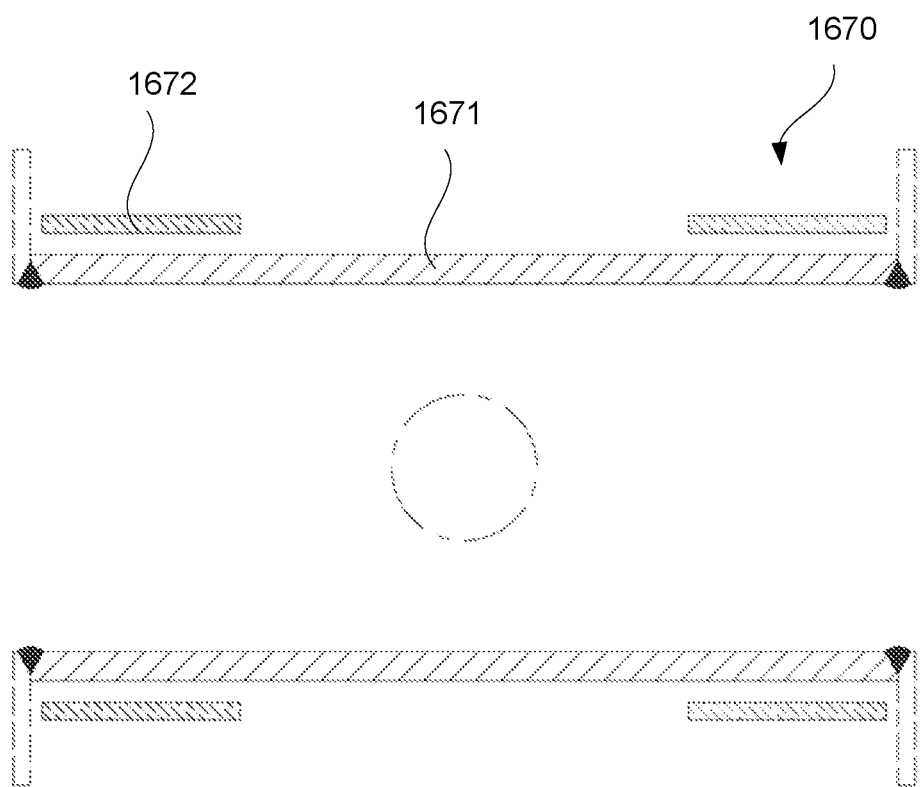
FIG. 16B is a schematic diagram illustrating a cross sectional view of the shielding cylinder of FIG. 16A, with a plurality of conductive components of the shielding cylinder each of which is in a sheet shape being mounted on an outer wall of a mounting cylinder by a mounting frame and arranged at intervals along a circumferential direction of the mounting cylinder.
Figure 16A:
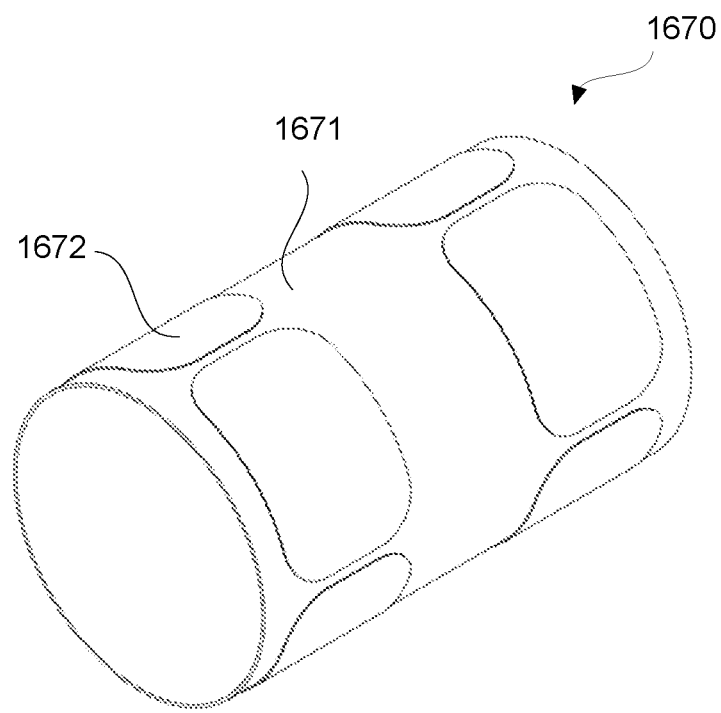
FIG. 16A is a schematic diagram illustrating a front perspective view of a shielding cylinder according to some embodiments of the present disclosure, a plurality of conductive components of the shielding cylinder each of which is in a sheet shape being mounted on an outer wall of a mounting cylinder by a mounting frame and arranged at intervals along a circumferential direction of the mounting cylinder.

FIG. 16A is a schematic diagram illustrating a front perspective view of a shielding cylinder 1670 according to some embodiments of the present disclosure. FIG. 16B is a schematic diagram illustrating a cross sectional view of the shielding cylinder 1670 of FIG. 16A.

In some embodiments, a shielding cylinder 1670 may include a mounting frame (not shown). A plurality of conductive components 1672 may be mounted on an inner wall and/or an outer wall of a mounting cylinder 1671 by the mounting frame. In such cases, there is a certain distance between the mounting cylinder 1671 and each of the plurality of conductive components 1672. In some embodiments, the plurality of conductive components 1672 may be in a sheet shape and/or a ring shape.

As shown in FIGS. 16A-B, the plurality of conductive components 1672 each of which is in the sheet shape may be mounted on the outer wall of the mounting cylinder 1671 by the mounting frame and arranged at intervals along a circumferential direction of the mounting cylinder 1671.

Figure 17B:
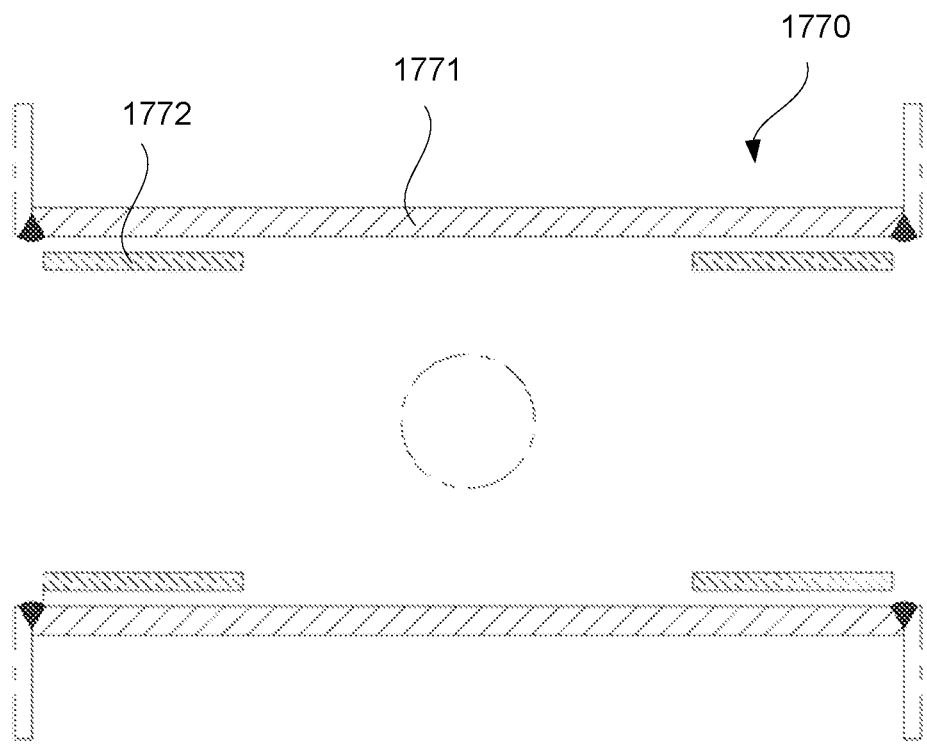
FIG. 17B is a schematic diagram illustrating a cross sectional view of the shielding cylinder of FIG. 17A, with a plurality of conductive components of the shielding cylinder each of which is in a sheet shape being mounted on an inner wall of a mounting cylinder by a mounting frame and arranged at intervals along a circumferential direction of the mounting cylinder.
Figure 17A:
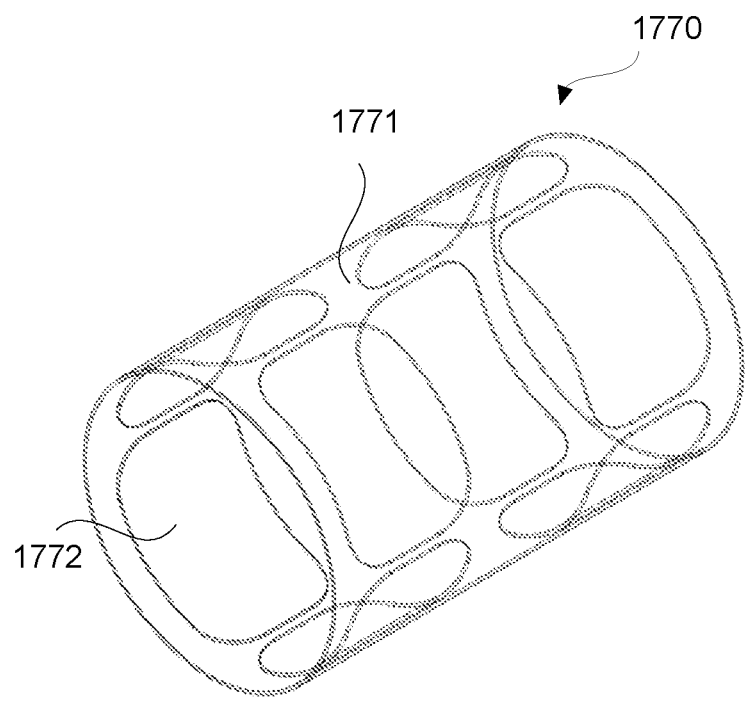
FIG. 17A is a schematic diagram illustrating a front perspective view of a shielding cylinder according to some embodiments of the present disclosure, a plurality of conductive components of the shielding cylinder each of which is in a sheet shape being mounted on an inner wall of a mounting cylinder by a mounting frame and arranged at intervals along a circumferential direction of the mounting cylinder.

FIG. 17A is a schematic diagram illustrating a front perspective view of a shielding cylinder 1770 according to some embodiments of the present disclosure. FIG. 17B is a schematic diagram illustrating a cross sectional view of the shielding cylinder 1770 of FIG. 17A. As shown in FIGS. 17A-B, a plurality of conductive components 1772 each of which is in a sheet shape may be mounted on an inner wall of a mounting cylinder 1771 by a mounting frame (not shown) and arranged at intervals along a circumferential direction of the mounting cylinder 1771.

Figure 18B:
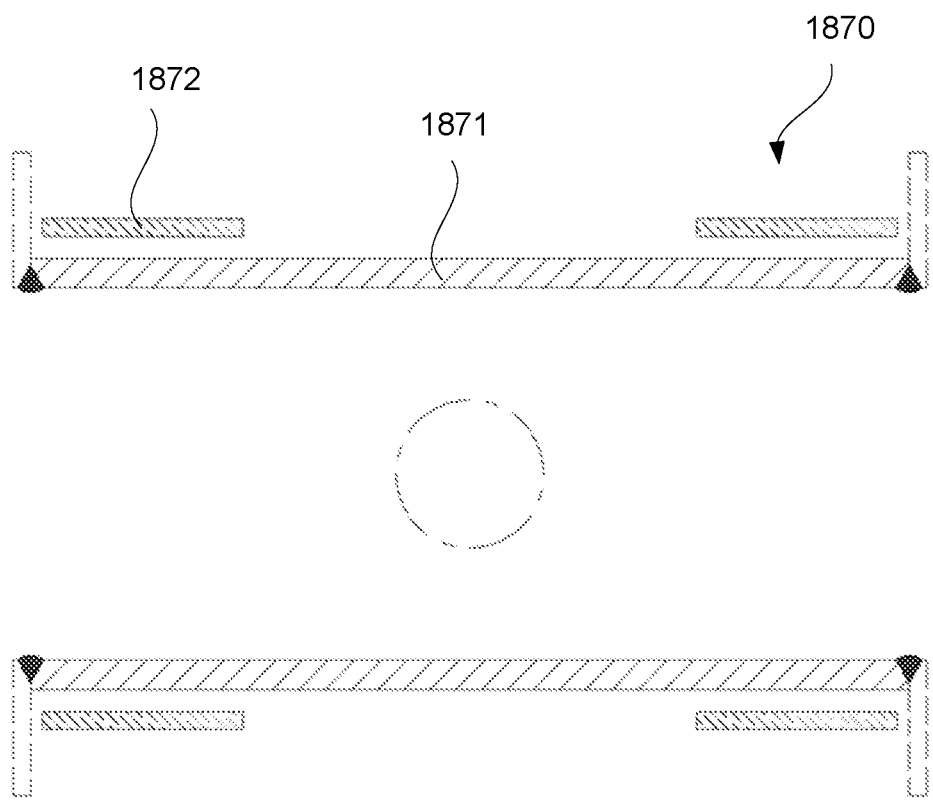
FIG. 18B is a schematic diagram illustrating a cross sectional view of the shielding cylinder of FIG. 18A, with two conductive components of the shielding cylinder each of which is in a ring shape being mounted on an outer wall of a mounting cylinder by a mounting frame and respectively fixed at positions close to two ends of the mounting cylinder.
Figure 18A:
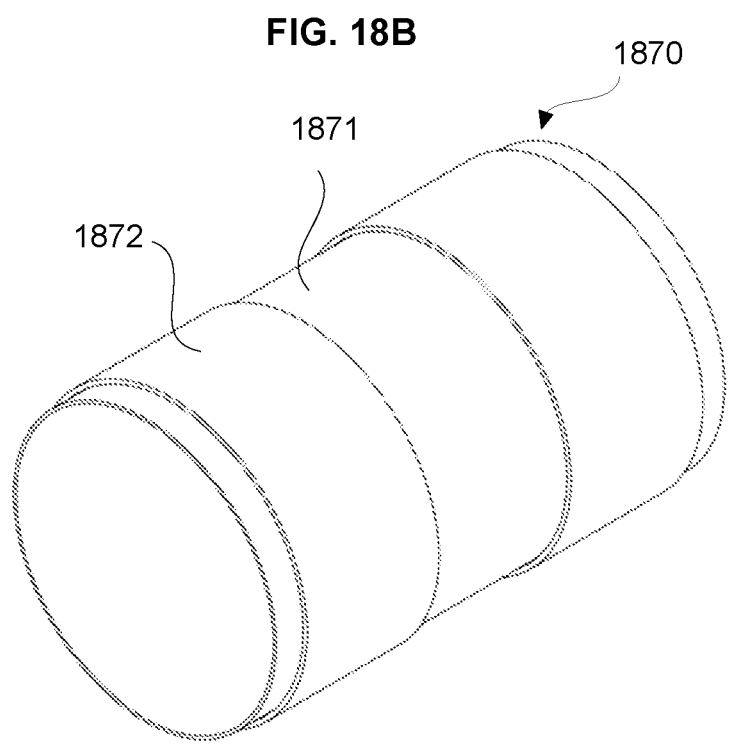
FIG. 18A is a schematic diagram illustrating a front perspective view of a shielding cylinder according to some embodiments of the present disclosure, two conductive components of the shielding cylinder each of which is in a ring shape being mounted on an outer wall of a mounting cylinder by a mounting frame and respectively fixed at positions close to two ends of the mounting cylinder.

FIG. 18A is a schematic diagram illustrating a front perspective view of a shielding cylinder 1870 according to some embodiments of the present disclosure. FIG. 18B is a schematic diagram illustrating a cross sectional view of the shielding cylinder 1870 of FIG. 18A. As shown in FIGS. 18A-B, two conductive components 1872 each of which is in a ring shape may be mounted on an outer wall of a mounting cylinder 1871 by a mounting frame (not shown) and respectively fixed at positions close to two ends of the mounting cylinder 1871.

Figure 19B:
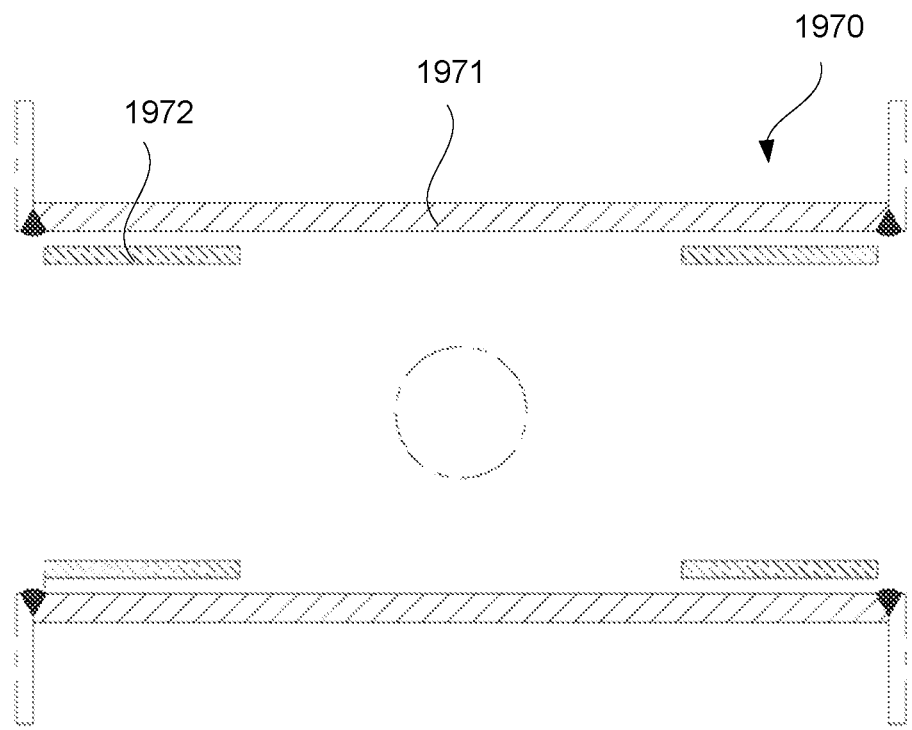
FIG. 19B is a schematic diagram illustrating a cross sectional view of the shielding cylinder of FIG. 19A, with two conductive components of the shielding cylinder each of which is in a ring shape being mounted on an inner wall of a mounting cylinder by a mounting frame and respectively fixed at positions close to two ends of the mounting cylinder.
Figure 19A:
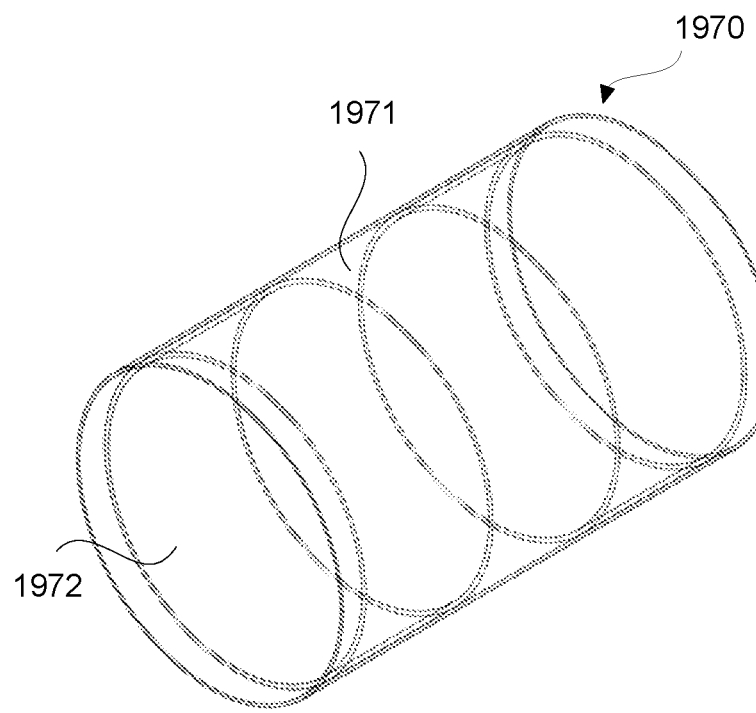
FIG. 19A is a schematic diagram illustrating a front perspective view of a shielding cylinder according to some embodiments of the present disclosure, two conductive components of the shielding cylinder each of which is in a ring shape being mounted on an inner wall of a mounting cylinder by a mounting frame and respectively fixed at positions close to two ends of the mounting cylinder.

FIG. 19A is a schematic diagram illustrating a front perspective view of a shielding cylinder 1970 according to some embodiments of the present disclosure. FIG. 19B is a schematic diagram illustrating a cross sectional view of the shielding cylinder 1970 of FIG. 19A. As shown in FIGS. 19A-B, two conductive components 1972 each of which is in a ring shape may be mounted on an inner wall of a mounting cylinder 1971 by a mounting frame (not shown) and respectively fixed at positions close to two ends of the mounting cylinder 1971.

Figure 20B:
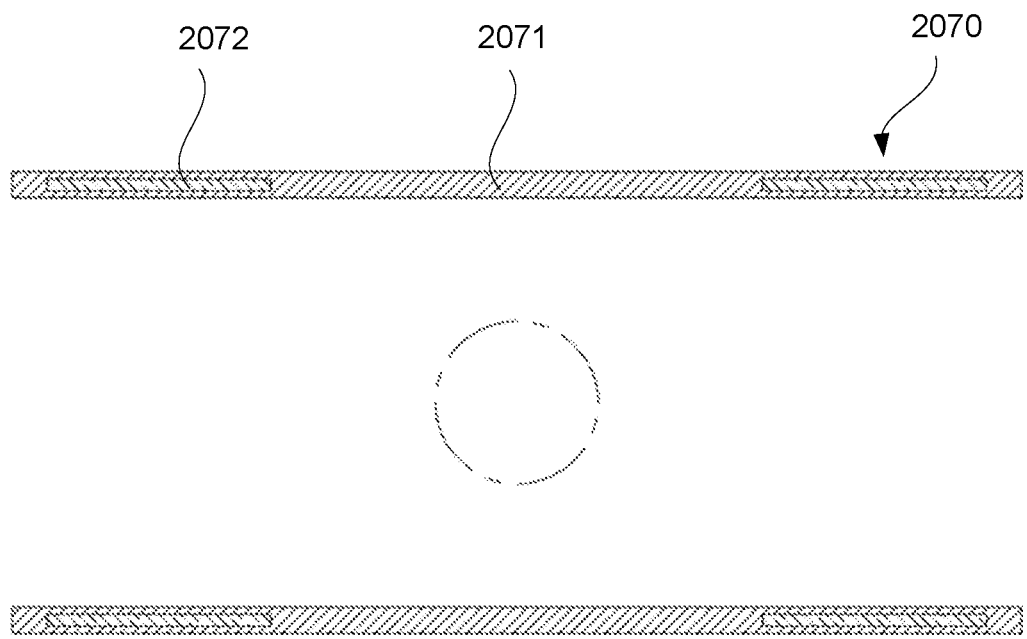
FIG. 20B is a schematic diagram illustrating a cross sectional view of the shielding cylinder of FIG. 18A, with a plurality of conductive components of the shielding cylinder each of which is in a sheet shape being embedded inside a mounting cylinder and arranged at intervals along a circumferential direction of the mounting cylinder.
Figure 20A:
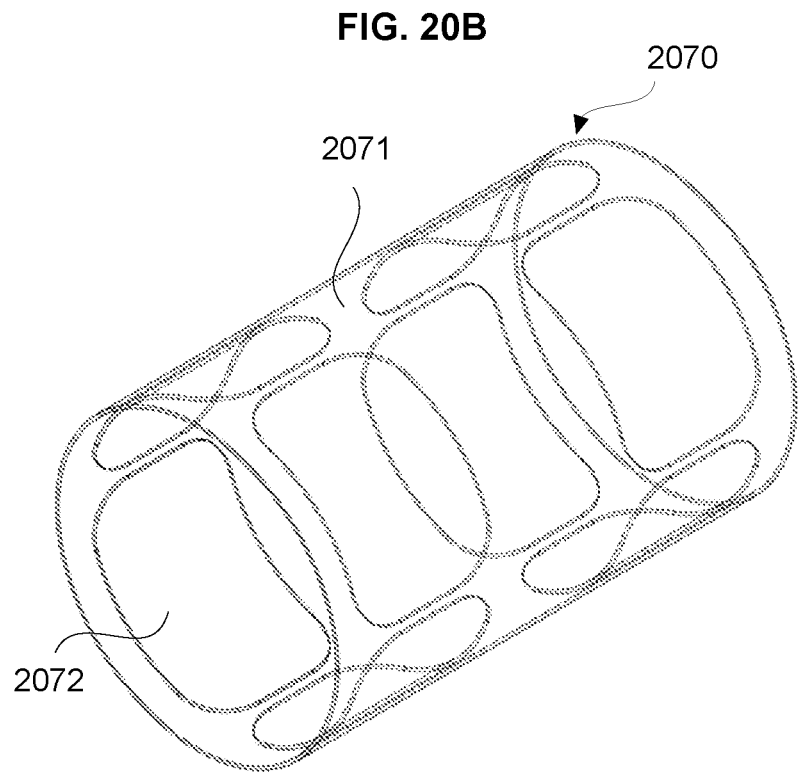
FIG. 20A is a schematic diagram illustrating a front perspective view of a shielding cylinder according to some embodiments of the present disclosure, a plurality of conductive components of the shielding cylinder each of which is in a sheet shape being embedded inside a mounting cylinder and arranged at intervals along a circumferential direction of the mounting cylinder.

FIG. 20A is a schematic diagram illustrating a front perspective view of a shielding cylinder 2070 according to some embodiments of the present disclosure. FIG. 20B is a schematic diagram illustrating a cross sectional view of the shielding cylinder 2070 of FIG. 20A.

In some embodiments, a plurality of conductive components 2072 may be embedded inside a mounting cylinder 2071. The plurality of conductive components 2072 and the mounting cylinder 2071 may be manufactured in an integrated manner, which is simple and efficient and can avoid excessive connection joints. For example, in a process of manufacturing the mounting cylinder 2071, the plurality of conductive components 2072 may be pre-arranged inside it, and then the plurality of conductive components 2072 and the mounting cylinder 2071 may be integrally cured and formed. As another example, the plurality of conductive components 2072 may be embedded inside the mounting cylinder 2071 by a metal casting process, etc. In some embodiments, a plurality of conductive components 2172 may be embedded inside other components (e.g., a gradient coil assembly) of an MRI system (e.g., the MRI system 100, the MRI system 500). In some embodiments, the plurality of conductive components 2072 may be in a sheet shape and/or a ring shape.

As shown in FIGS. 20A-B, the plurality of conductive components 2072 each of which is in the sheet shape may be embedded inside the mounting cylinder 2071 and arranged at intervals along a circumferential direction of the mounting cylinder 2071.

Figure 21B:
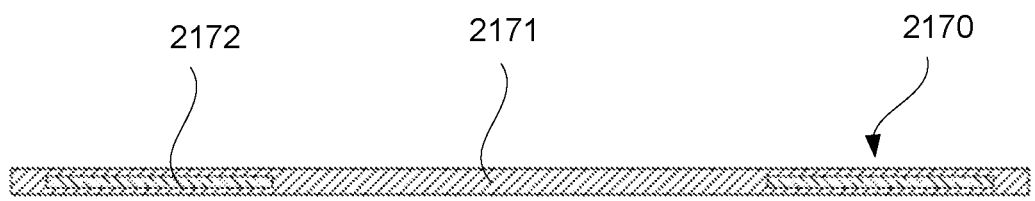
FIG. 21B is a schematic diagram illustrating a cross sectional view of the shielding cylinder of FIG. 21A, with two conductive components of the shielding cylinder each of which is in a ring shape being embedded inside a mounting cylinder and respectively fixed at positions close to two ends of the mounting cylinder.
Figure 21B:
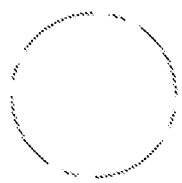
Figure 21B:
Figure 21A:
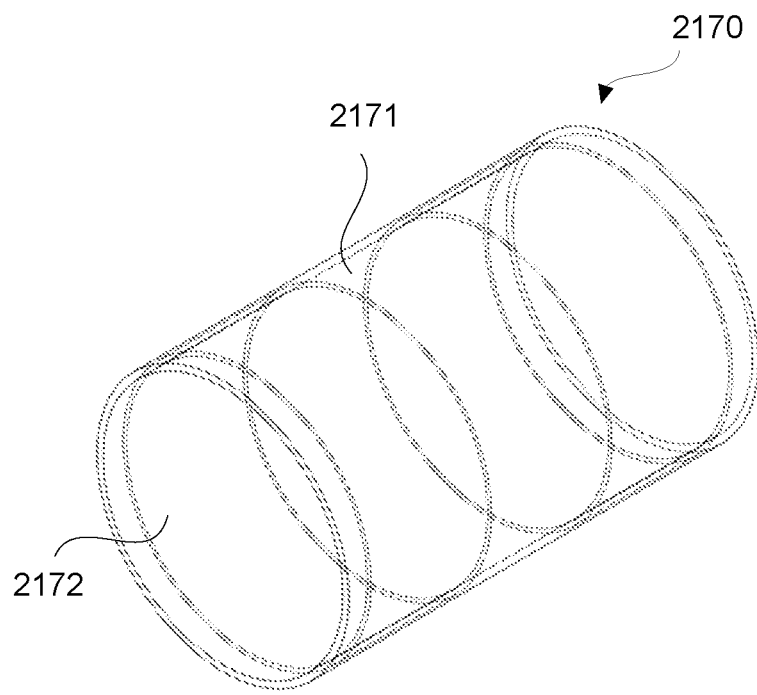

FIG. 21A is a schematic diagram illustrating a front perspective view of a shielding cylinder 2170 according to some embodiments of the present disclosure. FIG. 21B is a schematic diagram illustrating a cross sectional view of the shielding cylinder 2170 of FIG. 21A. As shown in FIGS. 21A-B, two conductive components 2172 each of which is in a ring shape may be embedded inside a mounting cylinder 2171 and respectively fixed at positions close to two ends of the mounting cylinder 2171.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer-readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2103, Perl, COBOL 2102, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software-only solution, for example, an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system for magnetic resonance imaging (MRI), comprising:
 a gradient coil assembly configured to form a gradient magnetic field; and
 a cryostat including
  a superconducting coil assembly, and
  a magnetic field shielding apparatus arranged on/in a component of the cryostat,
  wherein the component of the cryostat incudes an outer container, an inner container, an intermediate container arranged between the outer container and the inner container, and a superconducting coil assembly arranged in the inner container,
  wherein the superconducting coil assembly is configured to form a main magnetic field and the magnetic field shielding apparatus is configured to shield the superconducting coil assembly from a stray field of the gradient coil assembly, and
  wherein the magnetic field shielding apparatus includes a conductive shielding component, a shielding cylinder, or a combination thereof, and a plurality of conductive components arranged at positions close to two ends of the intermediate container of the cryostat.

2. The system of claim 1, wherein the conductive shielding component includes one or more shielding units that are arranged integrally or at intervals on the component of the cryostat along an axial direction of the superconducting coil assembly.

3. The system of claim 2, wherein a width of each of the one or more shielding units along the axial direction of the superconducting coil assembly is not less than a width of a coil of superconducting coil assembly corresponding to the shielding unit.

4. The system of claim 1, wherein the superconducting coil assembly includes one or more inner coils and one or more outer coils, for at least one of the one or more inner coils, a shielding unit being arranged on an inner side of the at least one of the one or more inner coils, the inner side being a side close to the gradient coil assembly.

5. The system of claim 4, wherein for at least one of the one or more outer coils, a shielding unit is arranged on an outer side of the at least one of the one or more outer coils, the outer side being a side away from the gradient coil assembly.

6. The system of claim 1, wherein the conductive shielding component is arranged on a target side, close to the gradient coil assembly, of at least one of the outer container, the inner container, or the intermediate container, the conductive shielding component being a hollow conductor.

7. The system of claim 1, wherein a temperature of the conductive shielding component is controlled through at least one external refrigeration source or a refrigeration component included in a cryostat.

8. The system of claim 1, wherein the shielding cylinder includes a mounting cylinder and the plurality of conductive components arranged on/in the mounting cylinder, the mounting cylinder including a target side, close to the gradient coil assembly, of the intermediate container of the cryostat.

9. The system of claim 8, wherein the mounting cylinder includes a plurality of mounting slots, the plurality of conductive components being arranged in the plurality of mounting slots.

10. The system of claim 9, wherein the plurality of mounting slots include through slots or blind slots, the blind slots being located on an inner wall or an outer wall of the mounting cylinder.

11. The system of claim 8, wherein the shielding cylinder includes a mounting frame, the plurality of conductive components being mounted on an inner wall or an outer wall of the mounting cylinder by the mounting frame.

12. The system of claim 8, wherein the plurality of conductive components are embedded inside the mounting cylinder.

13. The system of claim 8, wherein each of the plurality of conductive components is in a ring shape or a sheet shape, the plurality of conductive components in the sheet shape being arranged at intervals along a circumferential direction of the mounting cylinder.

14. The system of claim 1, wherein the plurality of conductive components are machined from a metal plate.

15. The system of claim 1, wherein the shielding cylinder includes a plurality of mounting joints, the plurality of conductive components being mounted by the plurality of mounting joints.

16. A system for magnetic resonance imaging (MRI), comprising:
a gradient coil assembly configured to form a gradient magnetic field; and
a cryostat including:
an outer container, an inner container, and an intermediate container between the outer container and the inner container;
a superconducting coil assembly configured to form a main magnetic field; and
a magnetic field shielding apparatus configured to shield the superconducting coil assembly from a stray field of the gradient coil assembly,
wherein the magnetic field shielding apparatus includes a conductive shielding component arranged on/in a target side, close to the gradient coil assembly, of the intermediate container.

17. The system of claim 16, wherein the conductive shielding component includes a hollow conductor arranged at intervals along an axial direction of the superconducting coil assembly.

18. A system for magnetic resonance imaging (MRI), comprising:
a gradient coil assembly configured to form a gradient magnetic field; and
a cryostat including:
an outer container, an inner container, and an intermediate container between the outer container and the inner container;
a superconducting coil assembly configured to form a main magnetic field; and
a magnetic field shielding apparatus configured to shield the superconducting coil assembly from a stray field of the gradient coil assembly,
wherein the magnetic field shielding apparatus includes a mounting cylinder and a plurality of conductive components arranged on/in the mounting cylinder, the mounting cylinder including a target side, close to the gradient coil assembly, of the intermediate container, the plurality of conductive components being arranged at positions close to two ends of the mounting cylinder.

19. The system of claim 18, wherein the plurality of conductive components are machined from a metal plate.

* * * * *